United States Patent
Chen et al.

(10) Patent No.: US 12,046,615 B2
(45) Date of Patent: Jul. 23, 2024

(54) SEMICONDUCTOR DEVICE INCLUDING DEEP TRENCH ISOLATION STRUCTURE COMPRISING DIELECTRIC STRUCTURE AND COPPER STRUCTURE AND METHOD OF MAKING THE SAME

(71) Applicant: TAIWAN SEMICONDUCTOR MANUFACTURING COMPANY LIMITED, Hsin-Chu (TW)

(72) Inventors: Yung-Hsiang Chen, Tainan (TW); Yu-Lung Yeh, Kaohsiung (TW); Yen-Hsiu Chen, Tainan (TW); Bo-Chang Su, Tainan (TW); Cheng-Hsien Chen, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 40 days.

(21) Appl. No.: 17/192,068

(22) Filed: Mar. 4, 2021

(65) Prior Publication Data
US 2021/0366954 A1 Nov. 25, 2021

Related U.S. Application Data

(60) Provisional application No. 63/028,657, filed on May 22, 2020.

(51) Int. Cl.
*H01L 27/146* (2006.01)
*H01L 21/762* (2006.01)

(52) U.S. Cl.
CPC .... *H01L 27/1463* (2013.01); *H01L 21/76224* (2013.01); *H01L 27/14623* (2013.01); *H01L 27/14685* (2013.01); *H01L 27/14627* (2013.01)

(58) Field of Classification Search
CPC .......... H01L 27/1463; H01L 21/76224; H01L 27/14623; H01L 27/14685;
(Continued)

(56) References Cited

U.S. PATENT DOCUMENTS

2015/0279878 A1* 10/2015 Ahmed ............. H01L 27/14685
257/446
2016/0112614 A1* 4/2016 Masuda ................. H04N 25/70
348/374
(Continued)

FOREIGN PATENT DOCUMENTS

CN 110739318 A 1/2020
DE 102018106754 A1 5/2019
(Continued)

OTHER PUBLICATIONS

First Office Action cited in corresponding Chinese Patent Application No. 202110558088.9, dated Apr. 30, 2024, 20 pages.

*Primary Examiner* — Nelson Garces
(74) *Attorney, Agent, or Firm* — Cooper Legal Group, LLC

(57) ABSTRACT

A semiconductor device is provided. The semiconductor device includes a first deep trench isolation (DTI) structure within a substrate. The first DTI structure includes a barrier structure, a dielectric structure, and a copper structure. The dielectric structure is between the barrier structure and the copper structure. The barrier structure is between the substrate and the dielectric structure.

20 Claims, 23 Drawing Sheets

(58) Field of Classification Search
CPC ......... H01L 27/14627; H01L 27/14621; H01L 27/14629; H01L 27/14649
See application file for complete search history.

(56) References Cited

U.S. PATENT DOCUMENTS

| | | |
|---|---|---|
| 2016/0225813 A1 | 8/2016 | Liao et al. |
| 2017/0062496 A1 | 3/2017 | Lai et al. |
| 2018/0151759 A1 | 5/2018 | Huang et al. |
| 2019/0259797 A1 | 8/2019 | Li et al. |
| 2020/0006410 A1* | 1/2020 | Wu .................. H01L 27/14685 |
| 2020/0021754 A1* | 1/2020 | Borthakur ............... H01L 33/20 |
| 2020/0135798 A1 | 4/2020 | Tsao et al. |
| 2021/0175380 A1* | 6/2021 | Borthakur ......... H01L 31/02327 |
| 2021/0293956 A1 | 9/2021 | Ogita |
| 2022/0157867 A1* | 5/2022 | Kawahara ......... H01L 27/14685 |

FOREIGN PATENT DOCUMENTS

| | | | |
|---|---|---|---|
| DE | 102019117664 A1 | 4/2020 | |
| JP | 2020013906 A | 1/2020 | |
| KR | 20180060969 A | 6/2018 | |
| KR | 20200050360 A | 5/2020 | |
| WO | WO-2021079572 A1 * | 4/2021 | ....... H01L 27/14623 |

* cited by examiner

SEMICONDUCTOR DEVICE INCLUDING DEEP TRENCH ISOLATION STRUCTURE COMPRISING DIELECTRIC STRUCTURE AND COPPER STRUCTURE AND METHOD OF MAKING THE SAME

RELATED APPLICATION

This application claims the benefit of U.S. Provisional Application No. 63/028,657 filed May 22, 2020, which is incorporated herein by reference in its entirety.

BACKGROUND

Semiconductor devices are used in a multitude of electronic devices, such as mobile phones, laptops, desktops, tablets, watches, gaming systems, and various other industrial, commercial, and consumer electronics. Semiconductor devices generally comprise semiconductor portions and wiring portions formed inside the semiconductor portions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
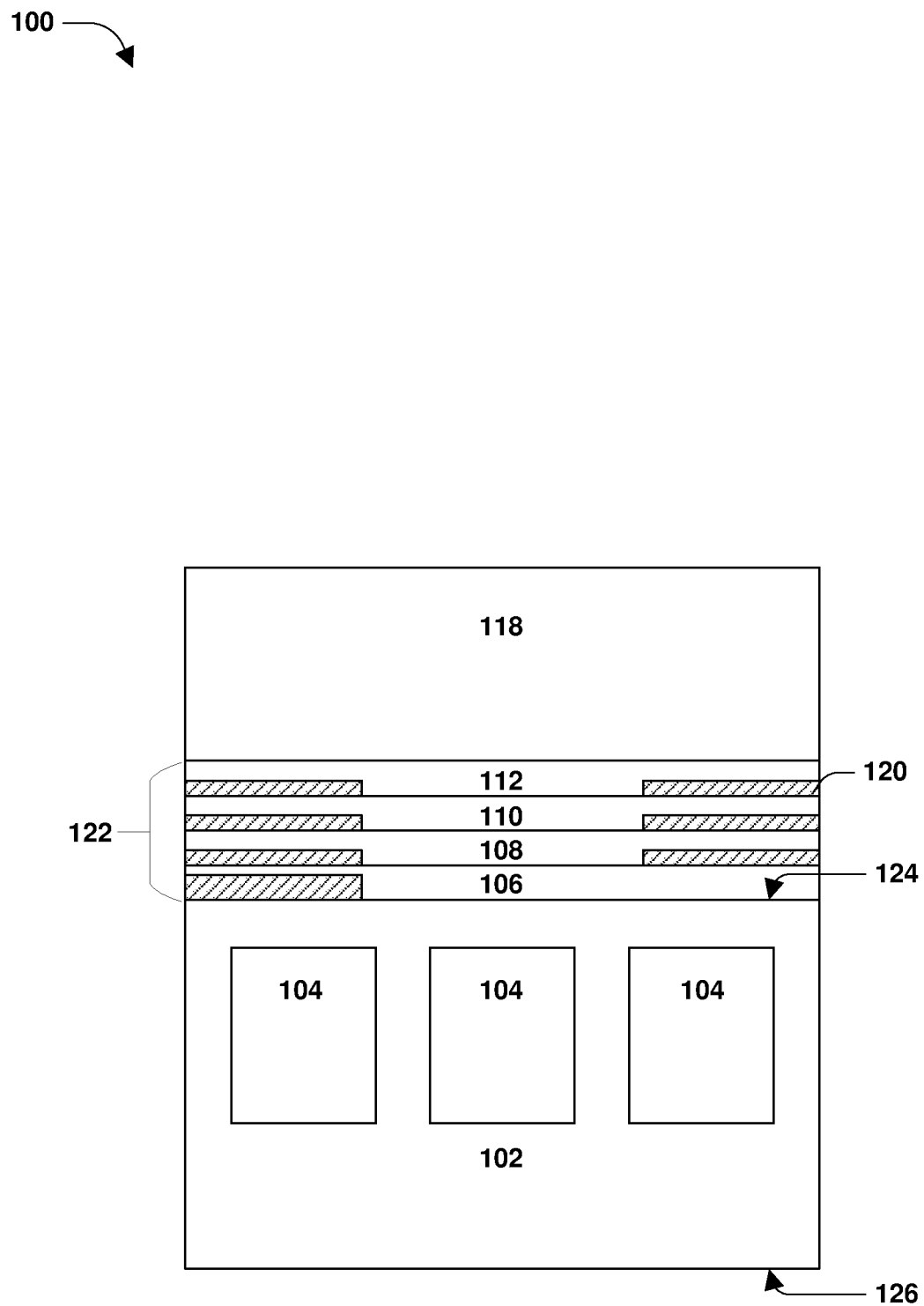
FIGS. 1-5 illustrate cross-sectional views of a semiconductor device at various stages of fabrication, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

A semiconductor device has a first deep trench isolation (DTI) structure in a substrate. The first DTI structure includes a barrier structure, a dielectric structure, and a copper structure. The dielectric structure is between the barrier structure and the copper structure. The barrier structure is between the substrate and the dielectric structure. In some embodiments, the first DTI structure is laterally offset from a first component, such as a first photodiode in the substrate. The first DTI structure reflects an increased amount of radiation, such as near-infrared (NIR) radiation, traveling away from the first component back towards the first component, as compared to DTI structures without the copper structure. Implementing the semiconductor device with the first DTI structure thereby reduces an amount of crosstalk between components of the semiconductor device, as compared to semiconductor devices without DTI structures that have the copper structure, where a lower amount of crosstalk provides for, among other things, improved resolution of an image generated based upon light detected by components in the substrate.

FIGS. 1-18B illustrate a semiconductor device 100 at various stages of fabrication, in accordance with some embodiments. FIGS. 1, 2, 3, 4, 5, 6A, 6B, 7A, 7B, 8, 9, 10, 12, 13, 14, 15A, 15B, 15C, 16, 17, 18A, and 18B illustrate cross-sectional views of the semiconductor device 100. FIG. 11A illustrates a top view of the semiconductor device 100, and FIG. 11B illustrates a cross-sectional view of the semiconductor device 100 taken along line B-B of FIG. 11A.

In some embodiments, a sensor is implemented via the semiconductor device 100. The sensor comprises at least one of an image sensor, a proximity sensor, a time of flight (ToF) sensor, an indirect ToF (iToF) sensor, a backside illumination (BSI) sensor, a complementary metal-oxide-semiconductor (CMOS) image sensor, a backside CMOS image sensor, or another type of sensor. Other structures and/or configurations of the semiconductor device 100 and/or the sensor are within the scope of the present disclosure.

FIG. 1 illustrates the semiconductor device 100 according to some embodiments. The semiconductor device 100 comprises a first substrate 102, an interconnect structure 122, and a second substrate 118. In some embodiments, the first substrate 102 corresponds to a device wafer of the semiconductor device 100 and the second substrate 118 corresponds to a carrier wafer of the semiconductor device 100. The first substrate 102 has a first side 126 and a second side 124, where the first side 126 corresponds to a back side of the first substrate 102 and the second side 124 corresponds to a front side of the first substrate 102.

The first substrate 102 comprises at least one of an epitaxial layer, a silicon-on-insulator (SOI) structure, a wafer, or a die formed from a wafer. The first substrate 102 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP or other suitable material. The first substrate 102 comprises at least one of monocrystalline silicon, crystalline silicon with a <100> crystallographic orientation, crystalline silicon with a <110> crystallographic orientation, crystalline silicon with a <111> crystallographic orientation or other suitable material. The first substrate 102 has at least one doped region. Other structures and/or configurations of the first substrate 102 are within the scope of the present disclosure.

In some embodiments, the semiconductor device 100 comprises components 104 in the first substrate 102. The components 104 are formed by at least one of doping, ion implantation, molecular diffusion, or other suitable techniques. In some embodiments, the components 104 comprise at least one of photodiodes, such as pinned layer photodiodes, phototransistors, or photogates, or other suitable components. At least some of the components 104 can vary from one another to have at least one of different heights, thicknesses, widths, material compositions, etc. Any number of components 104 in the first substrate 102 are contemplated.

At least some of the components 104 comprise at least one of germanium, indium, phosphorous, $BF_2$, arsenic, antimony, fluorine, InAs, InSb, GaSb, GaAs, InP, a silicide, or other suitable material. The components 104 are configured to sense radiation, such as incident light, which is projected towards the first substrate 102. At least some of the components 104 can comprise a material that is relatively highly absorptive to NIR radiation, such as radiation having a wavelength between about 700 nanometers to about 2500 nanometers. Other structures and/or configurations of the components 104 are within the scope of the present disclosure.

The interconnect structure 122 comprises one or more interconnect layers, such as at least one of a first interconnect layer 106, a second interconnect layer 108, a third interconnect layer 110, or a fourth interconnect layer 112. The one or more interconnect layers of the interconnect structure 122 comprise patterned dielectric layers and/or conductive layers that provide interconnections, such as wiring, between at least one of various doped features, circuitry, input/output, etc. of the semiconductor device 100. In some embodiments, the interconnect structure 122 comprises an interlayer dielectric and multilayer interconnect structures, such as at least one of contacts, vias, metal lines, or other type of structure. Other structures and configurations of the interconnect structure 122 are within the scope of the present disclosure. For purposes of illustration, the interconnect structure 122 comprises conductive lines 120, where the positioning and configuration of such conductive lines might vary depending upon design needs. The interconnect structure 122 at least one of overlies the first substrate 102, is in direct contact with the first substrate 102, or is in indirect contact with the first substrate 102.

The second substrate 118 comprises at least one of an epitaxial layer, a SOI structure, a wafer, or a die formed from a wafer. The second substrate 118 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP or other suitable material. The second substrate 118 comprises at least one of monocrystalline silicon, crystalline silicon with a <100> crystallographic orientation, crystalline silicon with a <110> crystallographic orientation, crystalline silicon with a <111> crystallographic orientation or other suitable material. The second substrate 118 has at least one doped region. Other structures and/or configurations of the second substrate 118 are within the scope of the present disclosure.

In some embodiments, the second substrate 118 is bonded with the interconnect structure 122, such as by at least one of one or more bonding layers, an adhesive, a bonding process, or other suitable techniques. In some embodiments where the second substrate 118 is bonded with the interconnect structure 122 using the one or more bonding layers, the one or more bonding layers are between the second substrate 118 and the interconnect structure 122. The second substrate 118 at least one of overlies the interconnect structure 122, is in direct contact with the interconnect structure 122, or is in indirect contact with the interconnect structure 122.

Figure 2:
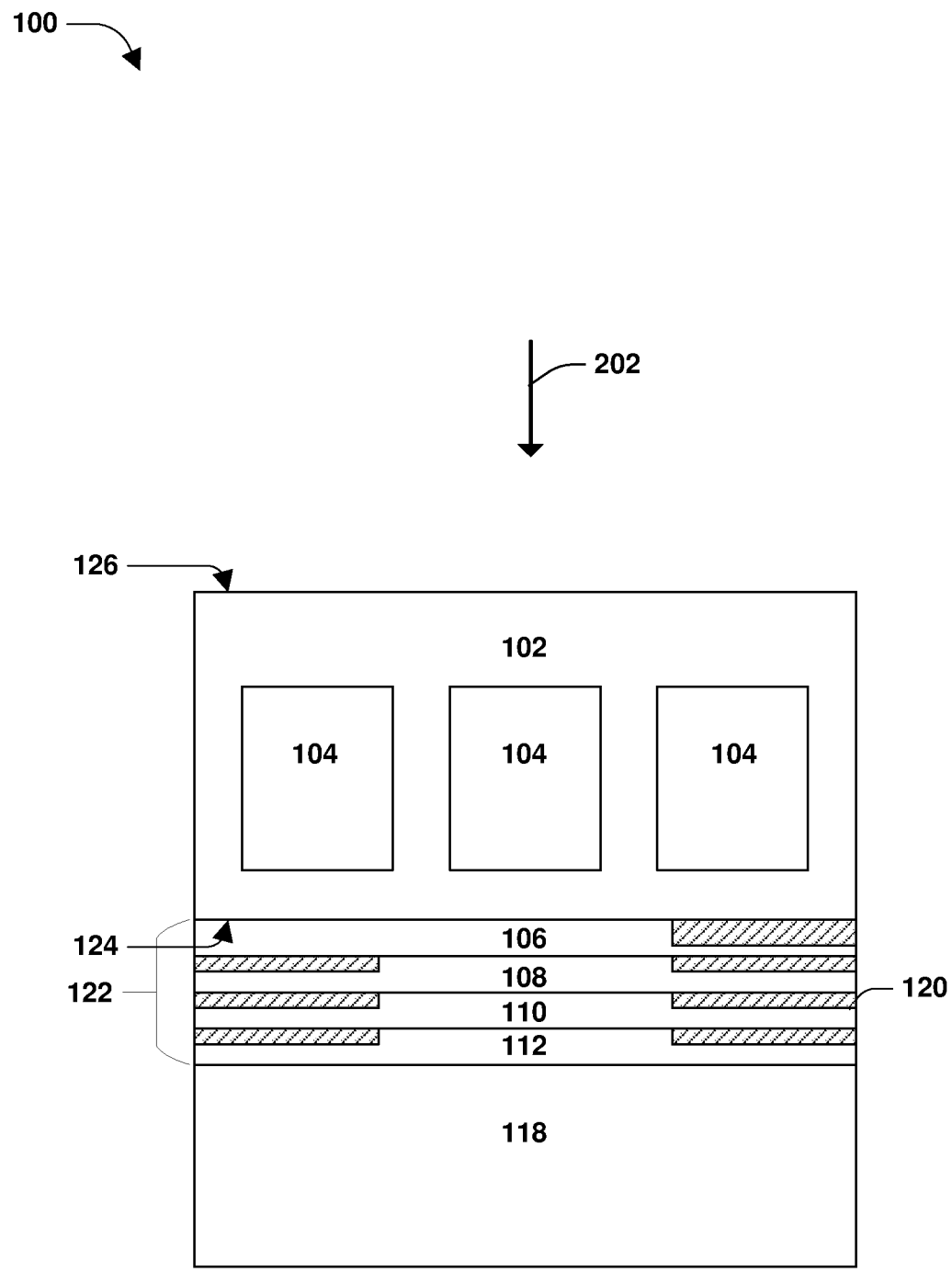

FIG. 2 illustrates the semiconductor device 100 inverted according to some embodiments. An inversion operation is performed such that the first substrate 102 overlies at least one of the interconnect structure 122 or the second substrate 118. As illustrated in FIG. 2, a top surface of the first substrate 102 corresponds to the back or first side 126 of the first substrate 102, and a bottom surface of the first substrate 102 corresponds to the front or second side 124 of the first substrate 102. In some embodiments, a portion of the first substrate 102 on the first side 126 of the first substrate 102 is removed, such as after the inversion operation, to reduce a thickness of the first substrate 102. The components 104 are configured to sense radiation, such as incident light, which is projected towards the first substrate 102 along direction 202.

Figure 3:
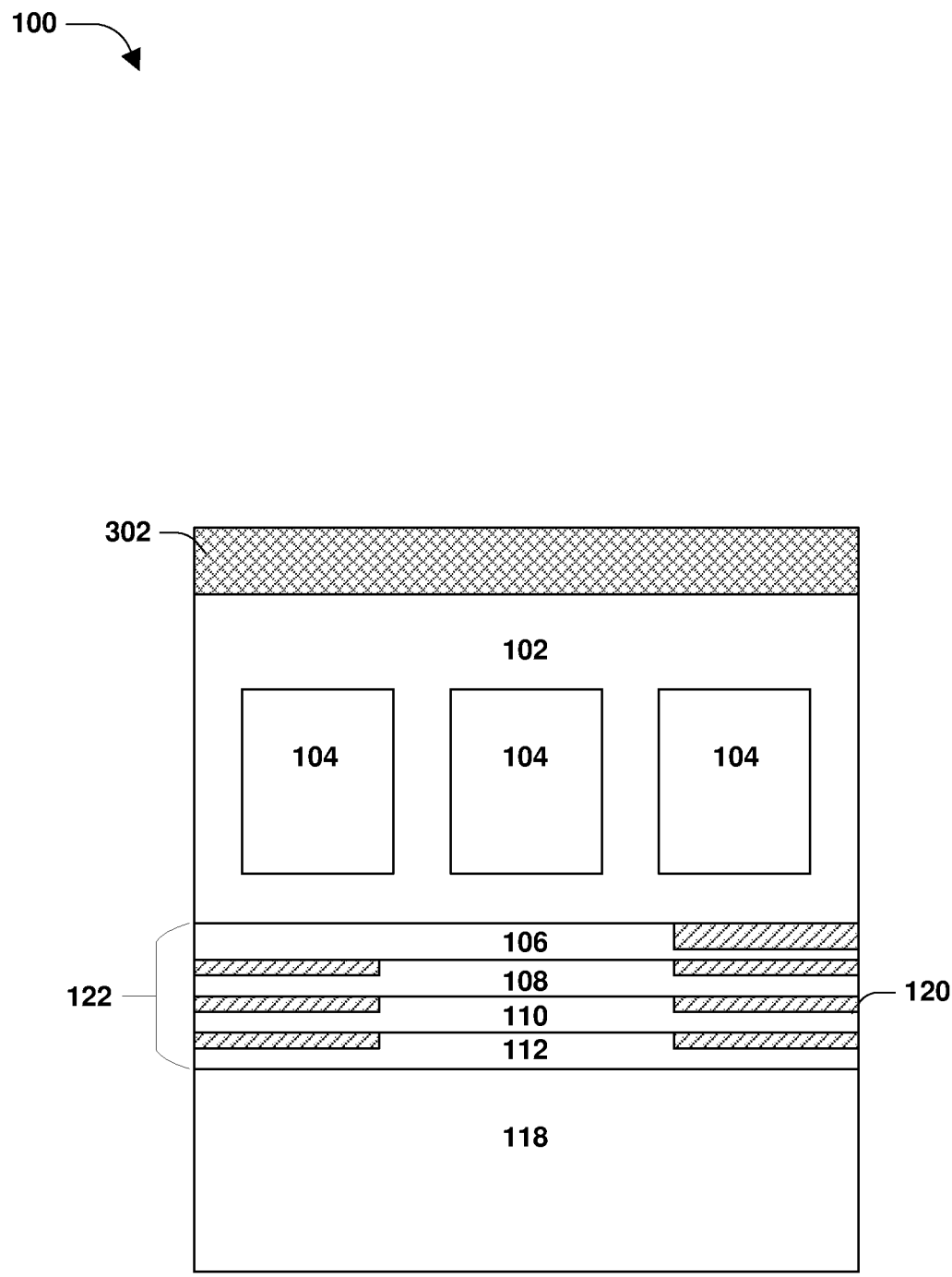

FIG. 3 illustrates a mask layer 302 formed over the first substrate 102, according to some embodiments. The mask layer 302 at least one of overlies the first substrate 102, is in direct contact with the first substrate 102, or is in indirect contact with the first substrate 102. In some embodiments, the mask layer 302 is a hard mask layer. The mask layer 302 comprises at least one of oxide, nitride, a metal, or other suitable material. The mask layer 302 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques. Other structures and/or configurations of the mask layer 302 are within the scope of the present disclosure.

Figure 4:
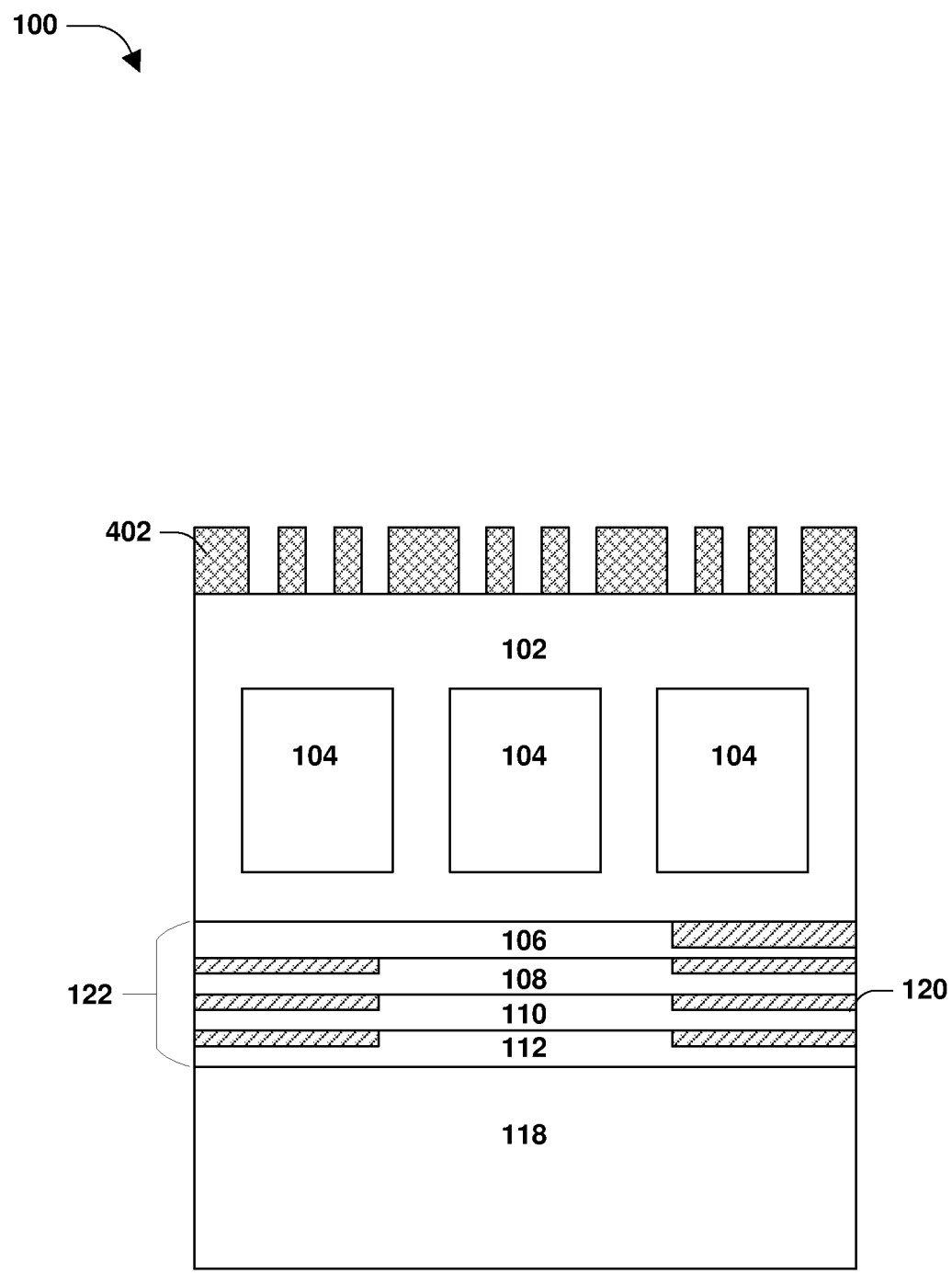

FIG. 4 illustrates the mask layer 302 patterned to form a patterned mask layer 402 over the first substrate 102, according to some embodiments. According to some embodiments, a photoresist (not shown) is used to form the patterned mask layer 402. The photoresist is formed over the mask layer 302 by at least one of PVD, sputtering, CVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer.

An etching process used to remove portions of the mask layer 302 to form the patterned mask layer 402 is at least one of a dry etching process, a wet etching process, an anisotropic etching process, an isotropic etching process or another suitable etching process. The etching process uses at least one of HF, diluted HF, HCl$_2$, H$_2$S, or other suitable material. In some embodiments, the etching process performed to remove portions of the mask layer 302 and form the patterned mask layer 402 also removes at least some of the first substrate 102, such as portions of the first substrate 102 underlying openings in the patterned mask layer 402. Other processes and/or techniques for forming the patterned mask layer 402 are within the scope of the present disclosure.

Figure 5:
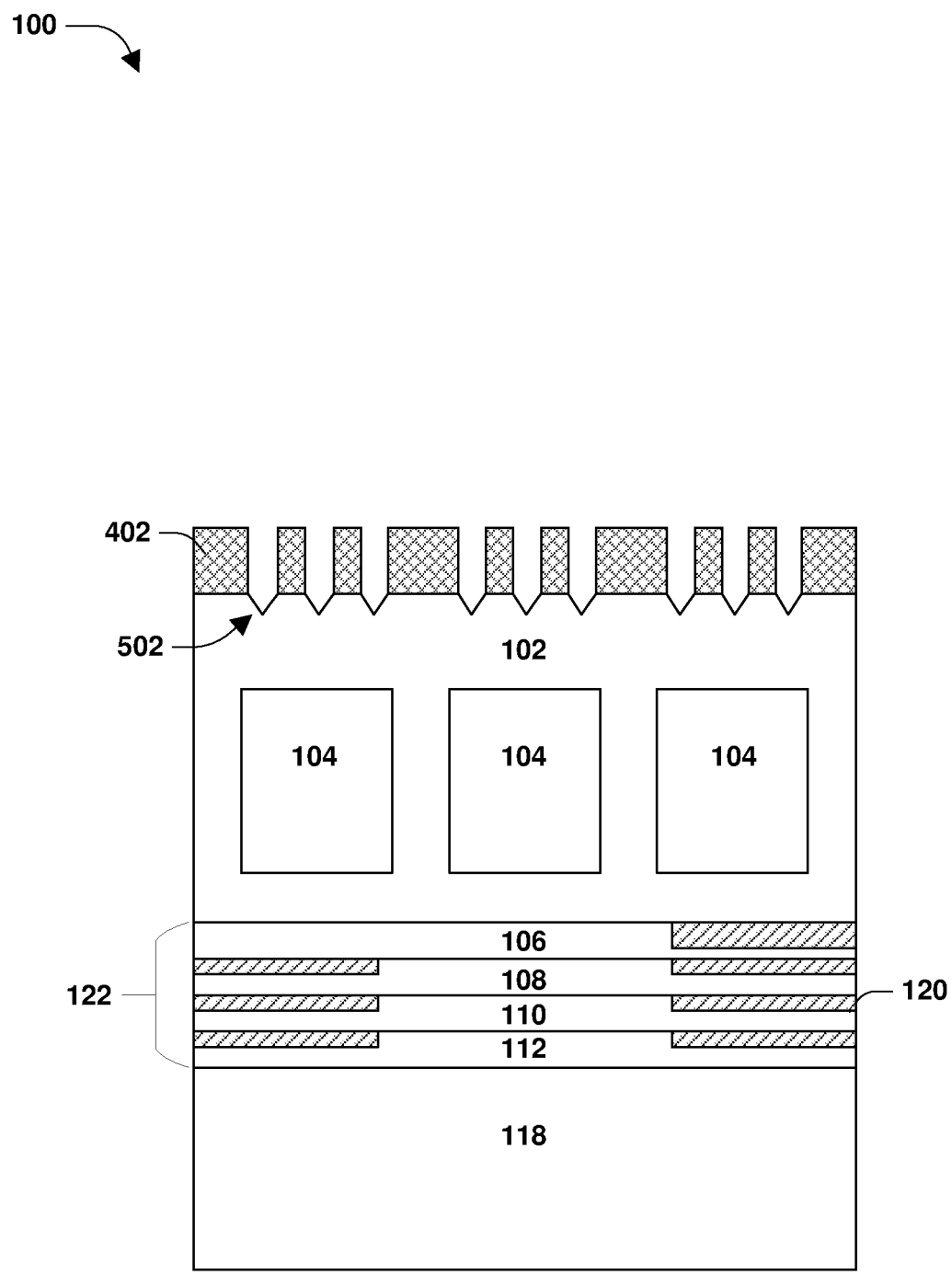

FIG. 5 illustrates use of the patterned mask layer 402 to form recesses 502 in the first substrate 102, according to some embodiments. In some embodiments, an etching process is performed to form the recesses 502, where openings in the patterned mask layer 402 allow one or more etchants applied during the etching process to remove portions of the first substrate 102 while the patterned mask layer 402 protects or shields portions of the first substrate 102 that are covered by the patterned mask layer 402. The etching process is at least one of a dry etching process, a wet etching process, an anisotropic etching process, an isotropic etching process, or another suitable etching process. The etching process uses at least one of HF, diluted HF, HCl$_2$, H$_2$S, or other suitable material. Other processes and/or techniques for forming the recesses 502 are within the scope of the present disclosure.

One or more recesses overlie a component 104. Any number of recesses 502 over a component 104 are contemplated. A portion of the first substrate 102 remains over the component 104 to separate the recess 502 from the component 104. Other structures and/or configurations of the recesses 502 are within the scope of the present disclosure.

Figure 6A:
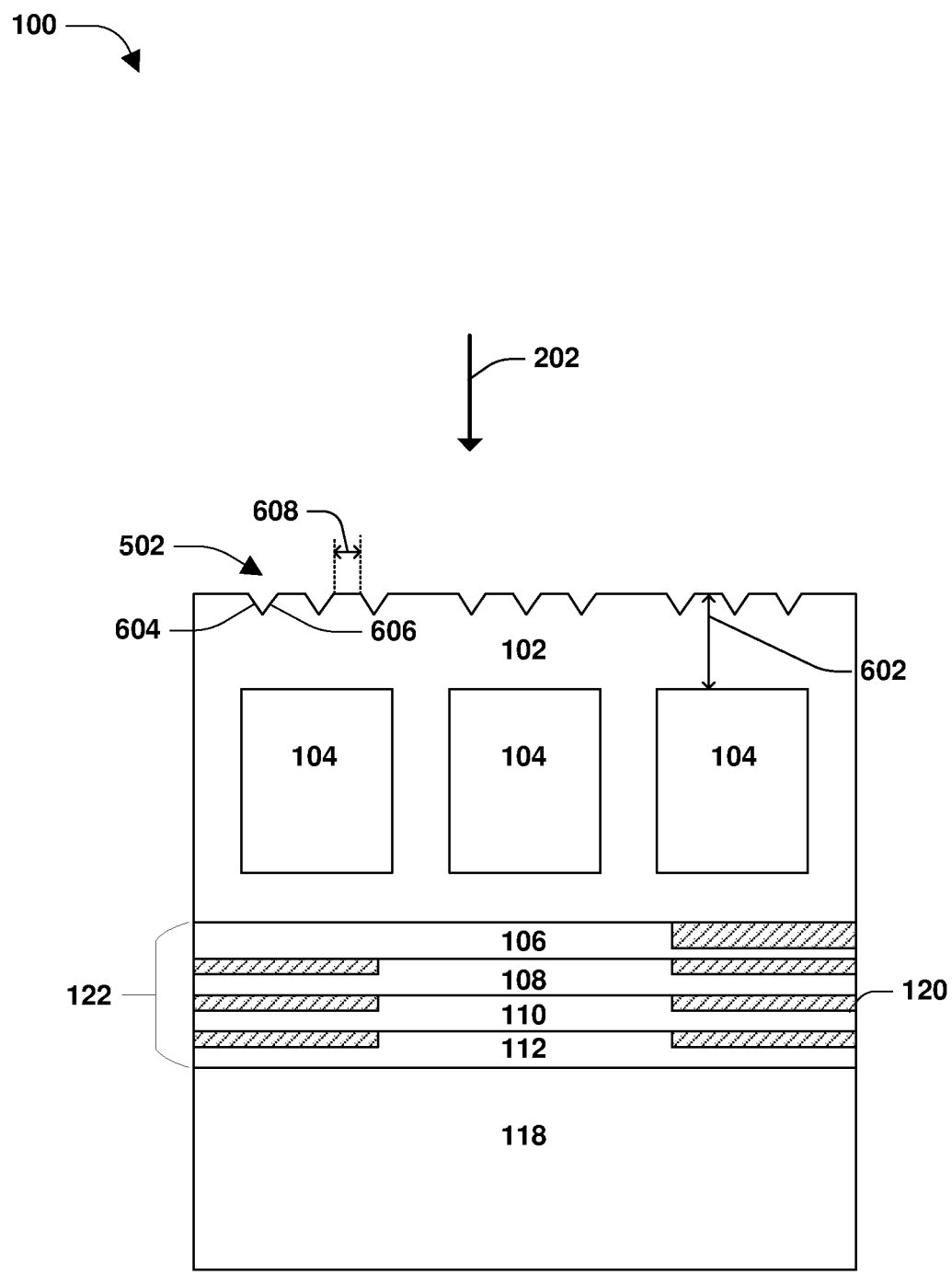
FIG. 6A illustrates a cross-sectional view of a semiconductor device at a stage of fabrication, in accordance with some embodiments.

FIG. 6A illustrates removal of the patterned mask layer 402, according to some embodiments. The patterned mask layer 402 is removed after the recesses 502 are formed. The patterned mask layer 402 is removed by at least one of chemical-mechanical polishing (CMP), etching, or other suitable techniques. The etching process is at least one of a dry etching process, a wet etching process, an anisotropic etching process, an isotropic etching process, or another suitable etching process. The etching process uses at least one of HF, diluted HF, HCl$_2$, H$_2$S, or other suitable material. Other processes and/or techniques for removing the patterned mask layer 402 are within the scope of the present disclosure.

A portion of the first substrate 102 defining a recess 502 has at least one of a first tapered sidewall 604 or a second tapered sidewall 606. At least one of the first tapered sidewall 604 has a first slope, such as a negative slope, or the second tapered sidewall 606 has a second slope, such as a positive slope. In some embodiments, the second slope is opposite in polarity relative to the first slope. In some embodiments, a recess 502 has a triangular shape. In some embodiments, a cross-sectional area of a recess 502 decreases along the direction 202, such that a width of an upper portion of the recess 502 is greater than a width of a lower portion of the recess 502. Other structures and/or configurations of the recesses 502 are within the scope of the present disclosure.

In some embodiments, the first substrate 102 having a specific crystallographic orientation, such as crystalline silicon with at least one of a <100> crystallographic orientation, a <110> crystallographic orientation, or a <111> crystallographic orientation, enables an etching process to form the first tapered sidewall 604 and the second tapered sidewall 606. In some embodiments, portions of the first substrate 102 have different crystallographic orientations, such as at least one of a <100> crystallographic orientation, a <110> crystallographic orientation, or a <111> crystallographic orientation, where etch rates of the etching process differ between the different crystallographic orientations at least due to different densities of the different crystallographic orientations, resulting in the first tapered sidewall 604 and the second tapered sidewall 606 being formed by the etching process.

In some embodiments, a first portion of the first substrate 102 having the first tapered sidewall 604 and the second tapered sidewall 606 has a first crystallographic orientation such as <111> crystallographic orientation, and a second portion of the first substrate 102 that is removed to form the recess 502 has a second crystallographic orientation such as <100> crystallographic orientation. In some embodiments, a density, such as a surface density, of the first crystallographic orientation is greater than a density, such as a surface density, of the second crystallographic orientation, such that the etching process removes the second portion of the first substrate 102 while removing little to none of the first portion of the first substrate 102 due to an etch rate of the second portion of the first substrate 102 being higher than an etch rate of the first portion of the first substrate 102. Other processes and/or techniques for forming the sidewalls defining the recesses 502 are within the scope of the present disclosure.

Figure 6B:
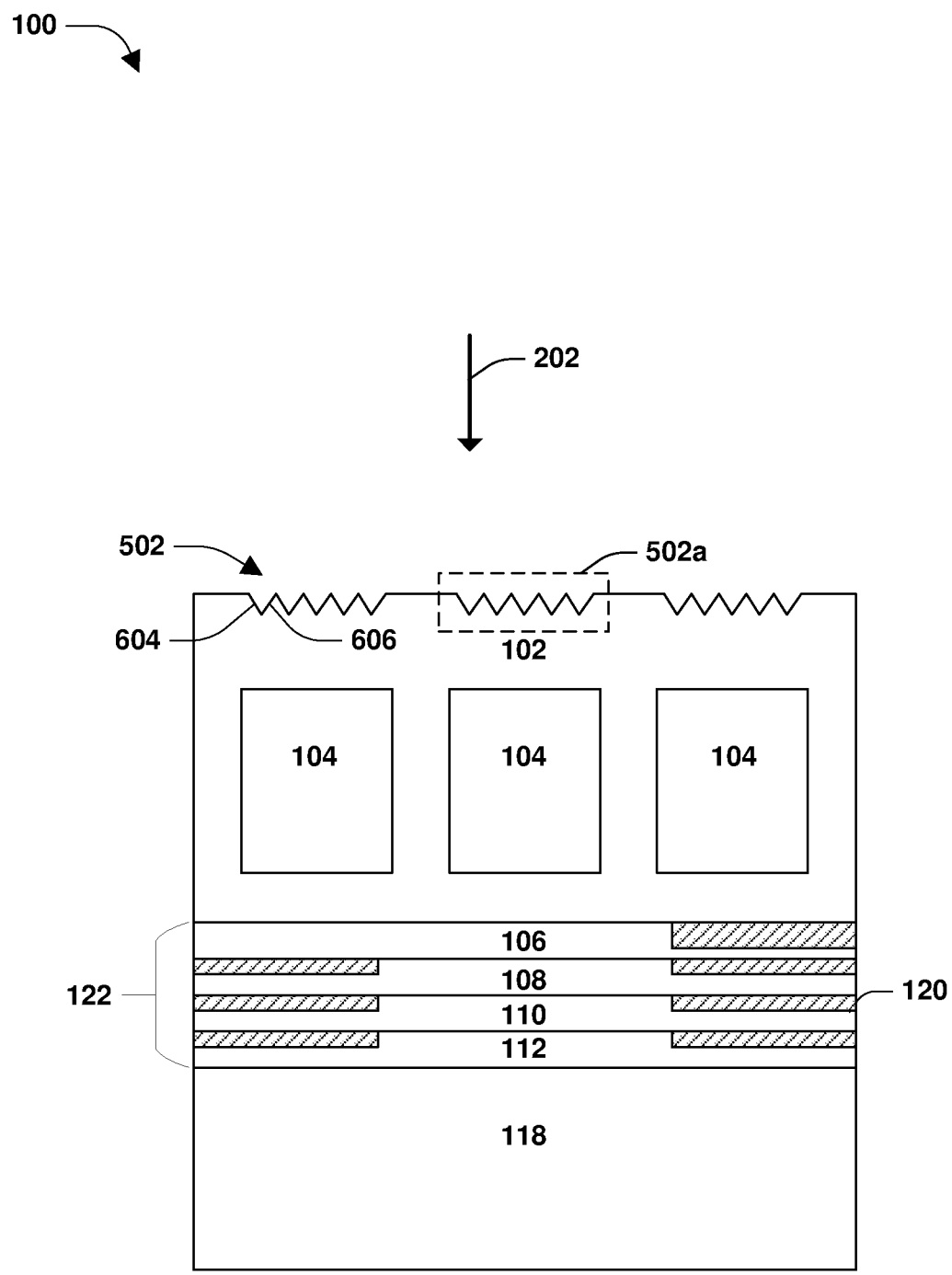
FIG. 6B illustrates a cross-sectional view of a semiconductor device at a stage of fabrication, in accordance with some embodiments.

A distance 602 between a top surface of a component 104 and at least one of an uppermost portion of the recess 502 or the top surface of the first substrate 102 is less than or equal to about 40,000 angstroms. A distance 608 between two adjacent recesses 502 is between about zero angstroms to about 20,000 angstroms. Other structures and/or configurations of a recess 502 relative to other elements, features, etc. are within the scope of the present disclosure. FIG. 6B illustrates a cross-sectional view of the semiconductor device 100, according to some embodiments where at least some recesses 502 are directly adjacent each other. In some embodiments, recesses, of a set of recesses 502a, are directly adjacent each other, such as in a saw tooth configuration. In some embodiments, at least some recesses of one or more sets of recesses 502a overlie a component 104.

Figure 7A:
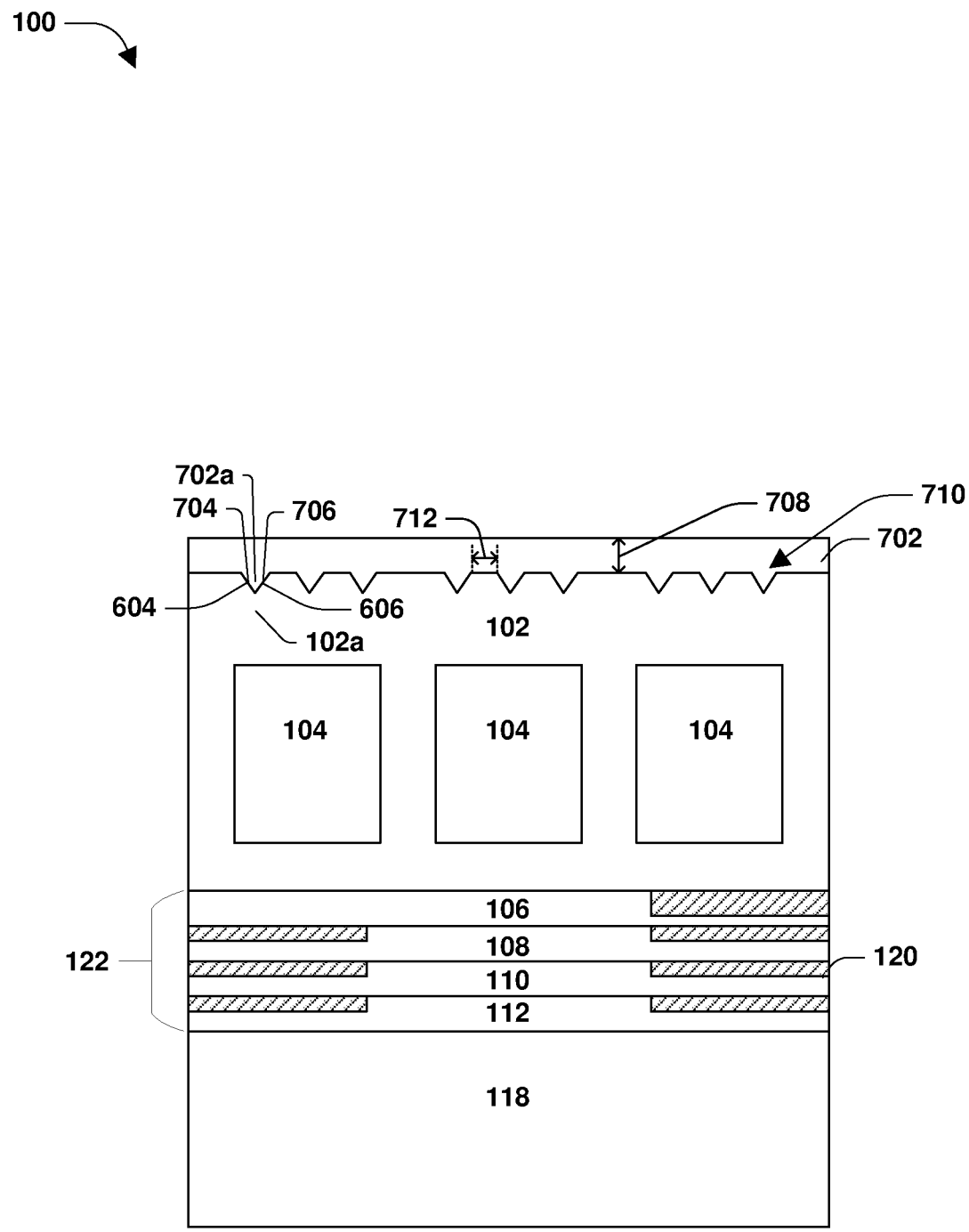
FIG. 7A illustrates a cross-sectional view of a semiconductor device at a stage of fabrication, in accordance with some embodiments.

FIG. 7A illustrates a first dielectric layer 702 formed over the first substrate 102, according to some embodiments. In some embodiments, the first dielectric layer 702 is in direct contact with the top surface of the first substrate 102 and/or sidewalls defined in the first substrate 102, such as sidewalls defining the recesses 502. In some embodiments, the first dielectric layer 702 is in indirect contact with the top surface of the first substrate 102 and/or sidewalls defined in the first substrate 102. Other structures and/or configurations of the first dielectric layer 702 are within the scope of the present disclosure.

In some embodiments, the semiconductor device 100 comprises a buffer layer (not shown) between the first substrate 102 and the first dielectric layer 702, such as formed over the first substrate 102 prior to forming the first dielectric layer 702. The buffer layer is in direct contact with the top surface of the first substrate 102 and/or sidewalls defined in the first substrate 102, such as sidewalls defining the recesses 502, or is in indirect contact with the top surface of the first substrate 102 and/or sidewalls defined in the first substrate 102.

The buffer layer comprises at least one of an anti-reflection coating, $SiO_2$, $HfSiON$, $HfSiO_x$, $HfAlO_x$, $HfO_2$, $ZrO_2$, $La_2O_3$, $Y_2O_3$, or other suitable material. The buffer layer is formed by at least one of PVD, sputtering, CVD, LPCVD, ALCVD, UHVCVD, RPCVD, ALD, MBE, LPE, spin on, growth, or other suitable techniques. In some embodiments, the buffer layer comprises a single layer that is configured to provide adhesion between the first dielectric layer 702 and the first substrate 102. According to some embodiments, the buffer layer comprises multiple layers, where an outer layer of the multiple layers is configured to provide adhesion with the first dielectric layer 702. When the semiconductor device 100 comprises the buffer layer, the first dielectric layer 702 at least one of overlies the buffer layer, is in direct contact with a top surface of the buffer layer, or is in indirect contact with the top surface of the buffer layer. Other structures and/or configurations of the buffer layer are within the scope of the present disclosure.

The first dielectric layer 702 comprises at least one of SiO, $SiO_2$, SiN, $Si_3N_4$, MgO, $Al_2O_3$, $Yb_2O_3$, ZnO, $Ta_2O_5$, $ZrO_2$, $HfO_2$, $TeO_2$, $TiO_2$, or other suitable material. The first dielectric layer 702 is formed by at least one of PVD, sputtering, CVD, LPCVD, ALCVD, UHVCVD, RPCVD, ALD, MBE, LPE, spin on, growth, or other suitable techniques. The first dielectric layer 702 is formed at least one of in the recesses 502 or over the top surface of the first substrate 102. A distance 708 between a top surface of the first dielectric layer 702 and the top surface of the first substrate 102 is less than or equal to about 10,000 angstroms.

A first portion 702a of the first dielectric layer 702 is in a recess 502. The first portion 702a of the first dielectric layer 702 has a third tapered sidewall 704 with which the first tapered sidewall 604 of the first substrate 102 aligns. When the semiconductor device 100 comprises the buffer layer over the first substrate 102, a portion of the buffer layer separates the third tapered sidewall 704 of the first portion 702a of the first dielectric layer 702 from the first tapered sidewall 604 of the first substrate 102.

The first portion 702a of the first dielectric layer 702 has a fourth tapered sidewall 706 with which the second tapered sidewall 606 of the first substrate 102 aligns. When the semiconductor device 100 comprises the buffer layer over the first substrate 102, a portion of the buffer layer separates the fourth tapered sidewall 706 of the first portion 702a of the first dielectric layer 702 from the second tapered sidewall 606 of the first substrate 102. The first portion 702a of the first dielectric layer 702 overlies a component 104. At least one of a portion of the buffer layer or a first portion 102a of the first substrate 102 separate the first portion 702a of the first dielectric layer 702 from the component 104.

The first portion 702a of the first dielectric layer 702 in the recess 502 is a high absorption (HA) structure 710, such as due, at least in part, to at least one of the third tapered sidewall 704, the first tapered sidewall 604, the fourth tapered sidewall 706, or the second tapered sidewall 606. The HA structure 710 directs more radiation to the component 104 underlying the first portion 702a of the first dielectric layer 702 as compared to a portion of the first dielectric layer 702 and a portion of the first substrate 102 that do not have one or more tapered sidewalls. One or more additional portions of the first dielectric layer 702 in recesses 502 in the first substrate 102 are similarly constructed HA structures 710 that overlie a component 104. Other structures and/or configurations of the HA structures 710 are within the scope of the present disclosure.

Figure 7B:
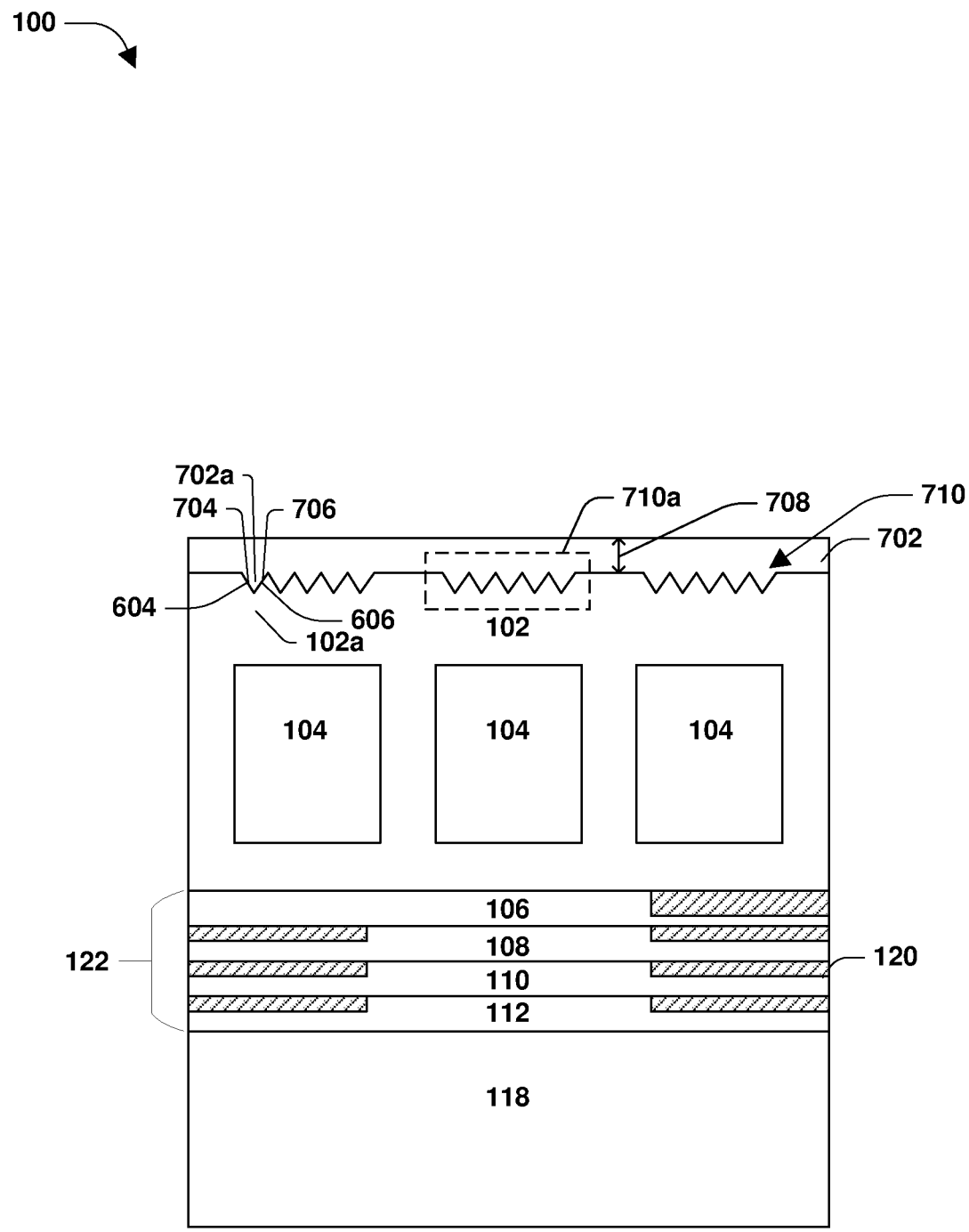
FIG. 7B illustrates a cross-sectional view of a semiconductor device at a stage of fabrication, in accordance with some embodiments.

A distance 712 between two adjacent HA structures 710 is between about zero angstroms to about 20,000 angstroms. Other structures and/or configurations of a HA structure 710 relative to other elements, features, etc. are within the scope of the present disclosure. FIG. 7B illustrates a cross-sectional view of the semiconductor device 100, according to some embodiments where at least some HA structures 710 are directly adjacent each other. In some embodiments, HA structures, of a set of HA structures 710a, are directly adjacent each other, such as in a saw tooth configuration. In some embodiments, at least some HA structures of one or more sets of HA structures 710a overlie a component 104.

Figure 8:
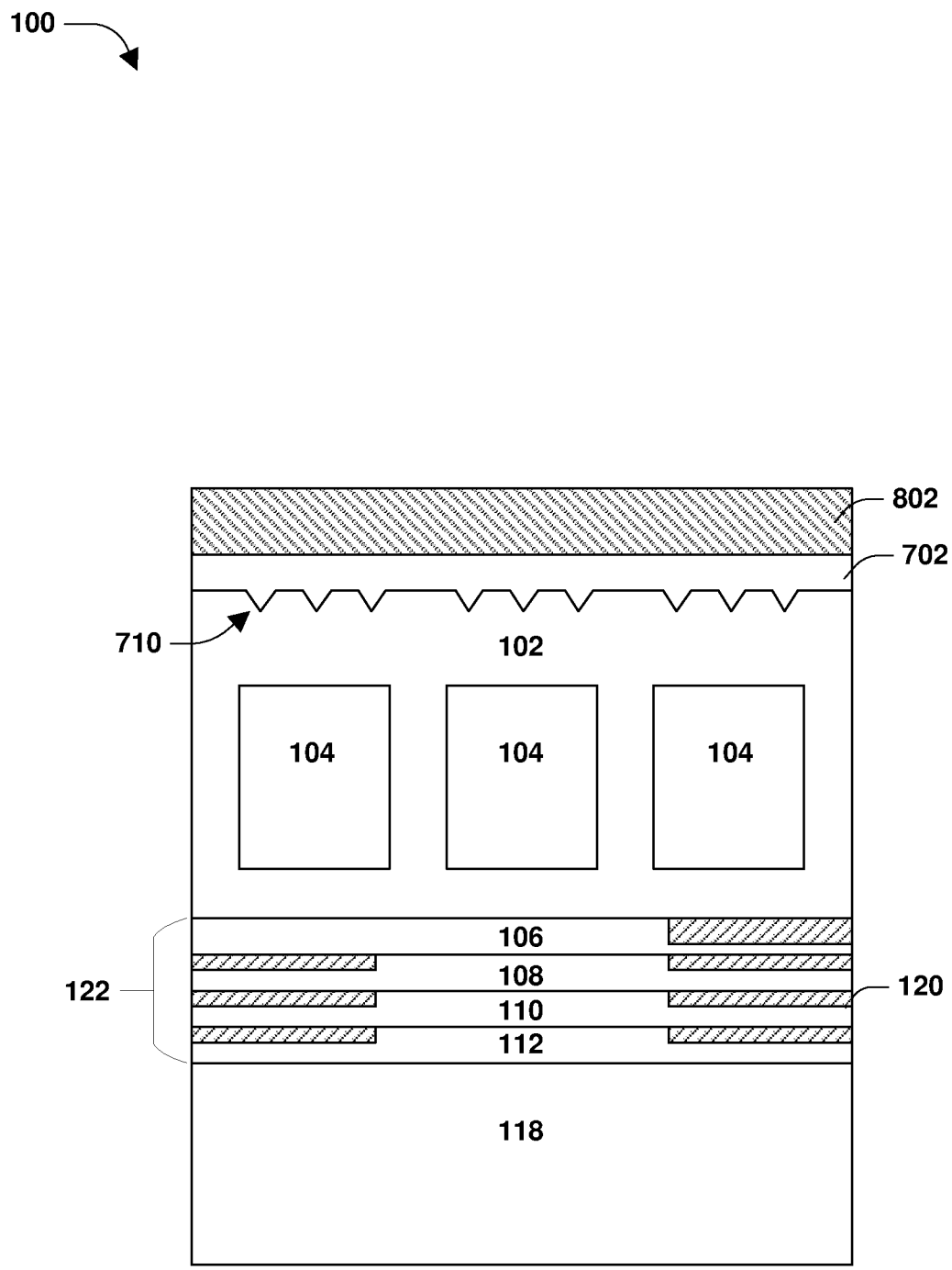
FIGS. 8-10 illustrate cross-sectional views of a semiconductor device at various stages of fabrication, in accordance with some embodiments.

FIG. 8 illustrates a photoresist 802 formed over the first dielectric layer 702, according to some embodiments. The photoresist 802 at least one of overlies the first dielectric layer 702, is in direct contact with the first dielectric layer 702, or is in indirect contact with the first dielectric layer 702. The photoresist 802 is formed by at least one of PVD, sputtering, CVD, LPCVD, ALCVD, UHVCVD, RPCVD, ALD, MBE, LPE, spin on, growth, or other suitable techniques. The photoresist 802 comprises a light-sensitive material, where properties, such as solubility, of the photoresist 802 are affected by light. The photoresist 802 is a negative photoresist or a positive photoresist.

Figure 9:
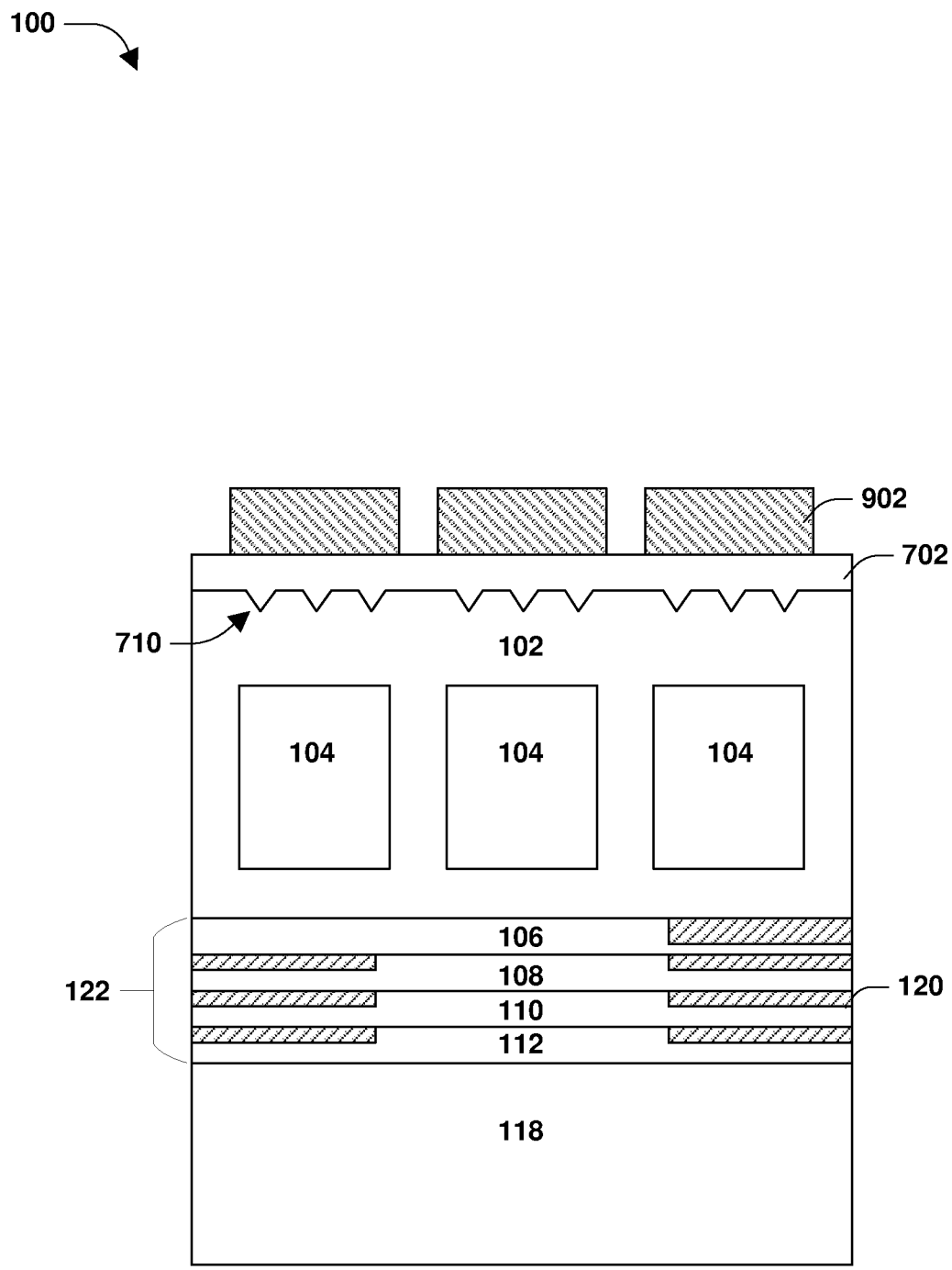

FIG. 9 illustrates the photoresist 802 patterned to form a patterned photoresist 902 over the first dielectric layer 702, according to some embodiments. The patterned photoresist 902 has openings exposing portions of the first dielectric layer 702. In some embodiments, the openings in the patterned photoresist 902 are between the components 104, such that the openings do not overlie or are laterally offset from the components 104. In some embodiments, an opening in the patterned photoresist 902 is between two adjacent components 104, such that the opening overlies a portion of the first substrate 102 between the two adjacent components 104. According to some embodiments, an opening in the patterned photoresist 902 overlies a portion of a component 104.

Figure 10:
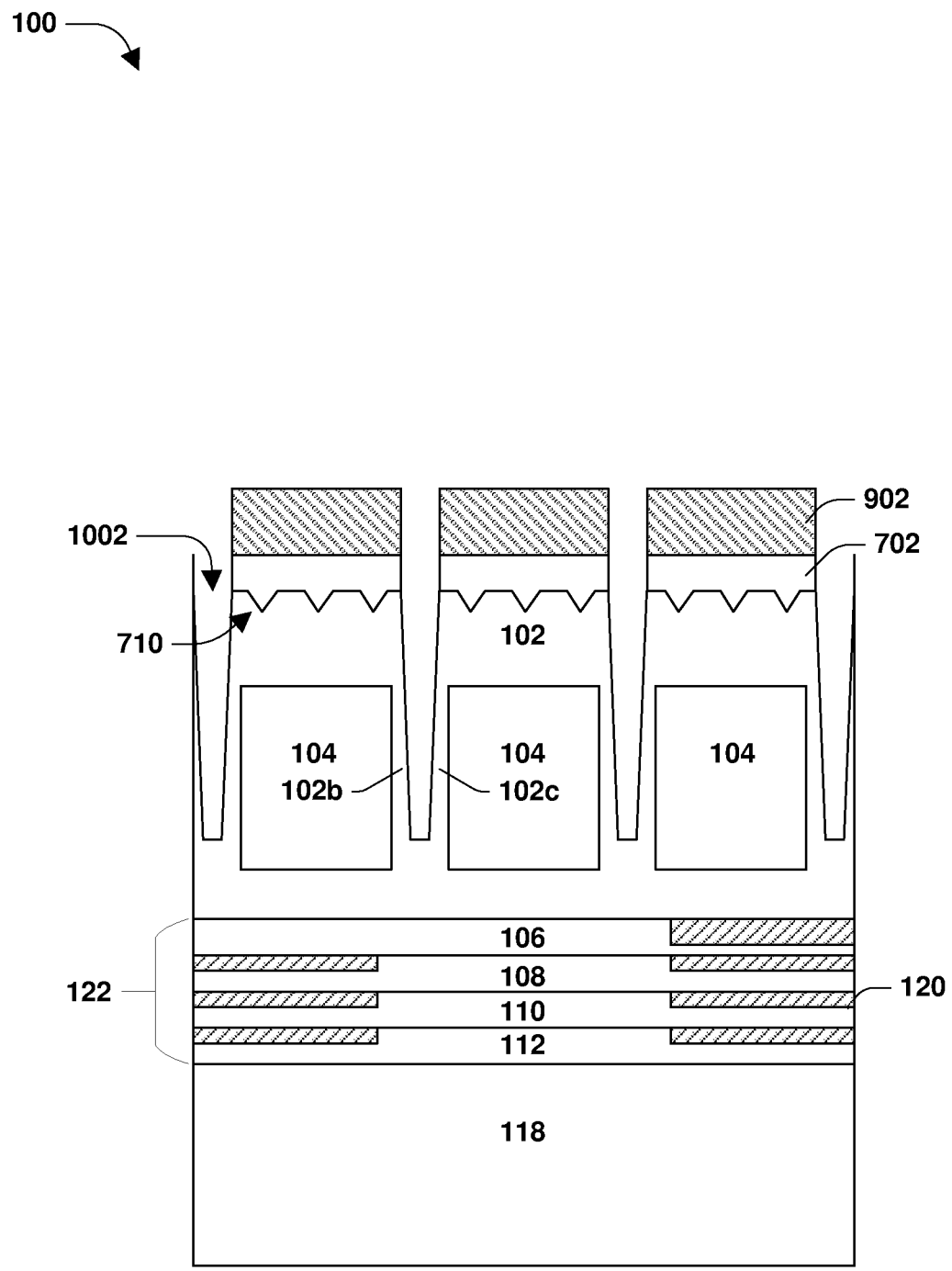
Figure 11A:
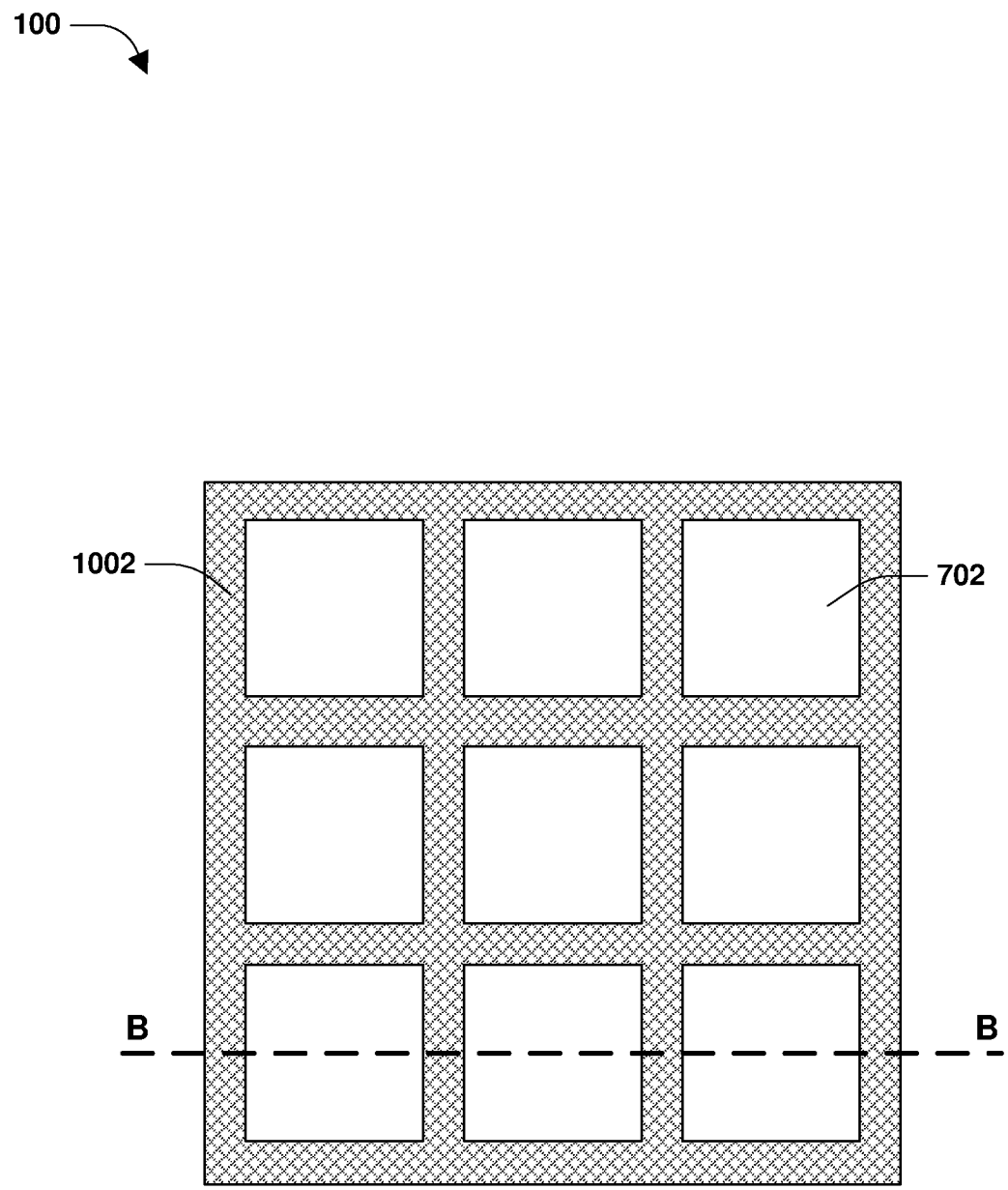
FIG. 11A illustrates a top view of a semiconductor device at a stage of fabrication, in accordance with some embodiments.
Figure 11B:
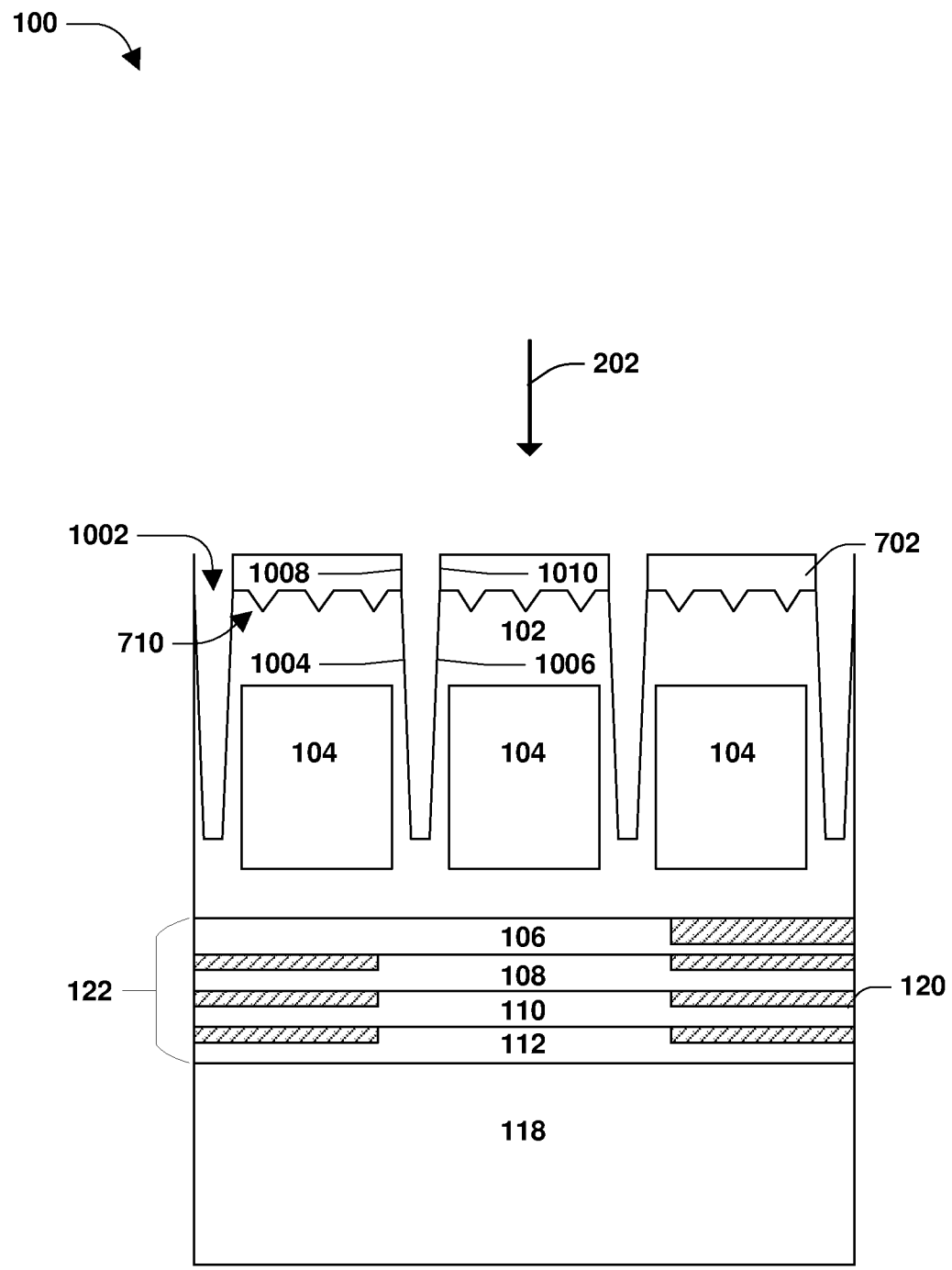
FIG. 11B illustrates a cross-sectional view of a semiconductor device taken along line B-B of FIG. 11A, in accordance with some embodiments.

FIG. 10 illustrates trenches 1002 formed using the patterned photoresist 902, according to some embodiments. The trenches 1002 extend through the first dielectric layer 702 and into the first substrate 102. The trenches 1002 are at least one of laterally offset from a component 104 or between two components 104. In some embodiments, a trench 1002 is between two adjacent components 104, a second portion 102b of the first substrate 102 separates the trench 1002 from a first component of the two adjacent components 104, and a third portion 102c of the first substrate 102 separates the trench 1002 from a second component of the two adjacent components 104. In some embodiments, an etching process is performed to form the trenches 1002, where openings in the patterned photoresist 902 allow one or more etchants applied during the etching process to remove portions of the first dielectric layer 702 and/or the first substrate 102 while the patterned photoresist 902 protects or shields portions of the first dielectric layer 702 and/or the first substrate 102 that are covered by the patterned photoresist 902. The etching process is at least one of a dry etching process, a wet etching process, an anisotropic etching process, an isotropic etching process, or another suitable etching process. The etching process uses at least one of HF, diluted HF, $HCl_2$, $H_2S$, or other suitable material. Other processes and/or techniques for forming the trenches 1002 are within the scope of the present disclosure.

FIGS. 11A-11B illustrate removal of the patterned photoresist 902, according to some embodiments. The patterned photoresist 902 is removed after the trenches 1002 are formed. The patterned photoresist 902 is removed by at least one of CMP, etching, or other suitable techniques. In some embodiments, removal of the patterned photoresist 902 exposes the top surface of the first dielectric layer 702 (shown in FIG. 11A).

A portion of the first substrate 102 defining a trench 1002 has a first sidewall 1004 and a second sidewall 1006 (shown in FIG. 11B). In some embodiments, at least some of the first sidewall 1004 is tapered and/or at least some of the second sidewall 1006 is tapered. The first sidewall 1004 has a first slope, such as a negative slope, and/or the second sidewall 1006 has a second slope, such as a positive slope. In some embodiments, the second slope is opposite in polarity relative to the first slope.

A portion of the first dielectric layer 702 defining a trench 1002 has a third sidewall 1008 and a fourth sidewall 1010. In some embodiments, at least some of the third sidewall 1008 is tapered and/or at least some of the fourth sidewall 1010 is tapered. The third sidewall 1008 has a first slope, such as a negative slope, and/or the fourth sidewall 1010 has a second slope, such as a positive slope. In some embodiments, the second slope is opposite in polarity relative to the first slope. In some embodiments, a cross-sectional area of a trench 1002 decreases along the direction 202, such that a width of an upper portion of the trench 1002 is greater than a width of a lower portion of the trench 1002.

According to some embodiments, at least some of a sidewall defining a trench 1002, such as at least some of the first sidewall 1004, at least some of the second sidewall 1006, at least some of the third sidewall 1008, and/or at least some of the fourth sidewall 1010, extend vertically, such as in a direction parallel to the direction 202. Other structures and/or configurations of the trenches 1002 are within the scope of the present disclosure.

In some embodiments, a lowermost portion of a trench 1002 is lower than an uppermost portion of a component 104. According to some embodiments, the lowermost portion of the trench 1002 is higher than a lowermost portion of the component 104. According to some embodiments, the lowermost portion of the trench 1002 is lower than the lowermost portion of the component 104. According to some embodiments, the lowermost portion of the trench 1002 is level or coplanar with the lowermost portion of the component 104. Other structures and/or configurations of the trenches 1002 relative to the components 104, other elements, features, etc. are within the scope of the present disclosure.

Figure 12:
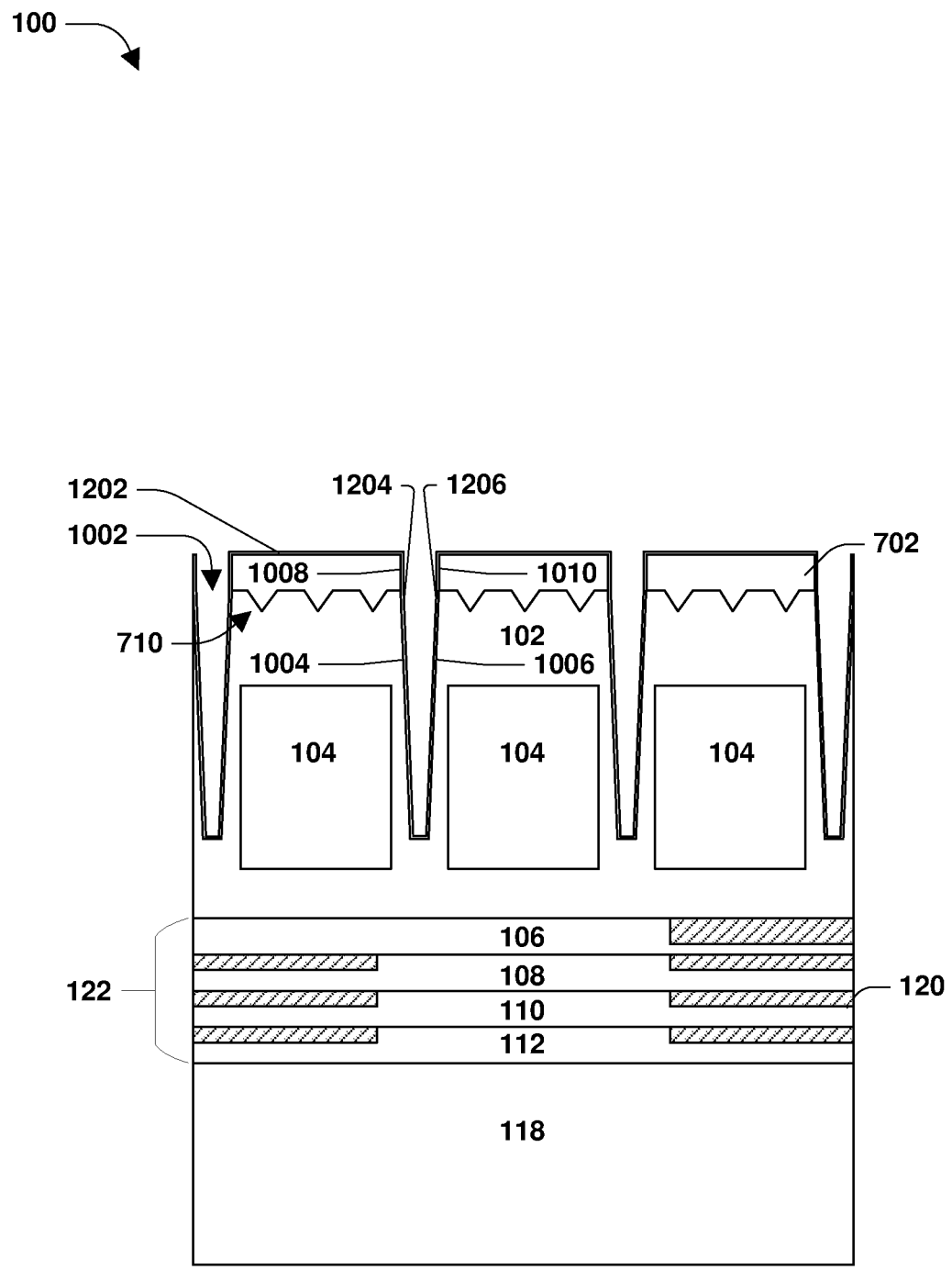
FIGS. 12-14 illustrate cross-sectional views of a semiconductor device at various stages of fabrication, in accordance with some embodiments.

FIG. 12 illustrates a first barrier layer 1202 formed over the first dielectric layer 702 and in the trenches 1002, according to some embodiments. In some embodiments, the first barrier layer 1202 is in direct contact with the top surface of the first dielectric layer 702 and/or sidewalls defined in the first substrate 102 and/or the first dielectric layer 702, such as sidewalls defining the trenches 1002. In some embodiments, the first barrier layer 1202 is in indirect contact with the top surface of the first dielectric layer 702 and/or sidewalls defined in the first substrate 102 and/or the first dielectric layer 702. Other structures and/or configurations of the first barrier layer 1202 relative to other elements, features, etc. are within the scope of the present disclosure.

The first barrier layer 1202 comprises at least one of aluminum oxide, $Al_2O_3$, hafnium oxide, tantalum nitride, or other suitable material. The first barrier layer 1202 is formed by at least one of PVD, sputtering, CVD, LPCVD, ALCVD, UHVCVD, RPCVD, ALD, MBE, LPE, spin on, growth, or other suitable techniques.

A first portion of the first barrier layer 1202 is in a trench 1002. The first portion of the first barrier layer 1202 has a fifth sidewall 1204 with which at least one of the first sidewall 1004 of the first substrate 102 or the third sidewall 1008 of the first dielectric layer 702 aligns. The first portion of the first barrier layer 1202 in the trench 1002 has a sixth sidewall 1206 with which at least one of the second sidewall 1006 of the first substrate 102 or the fourth sidewall 1010 of the first dielectric layer 702 aligns. Other structures and/or configurations of the first barrier layer 1202 relative to other elements, features, etc. are within the scope of the present disclosure.

Figure 13:
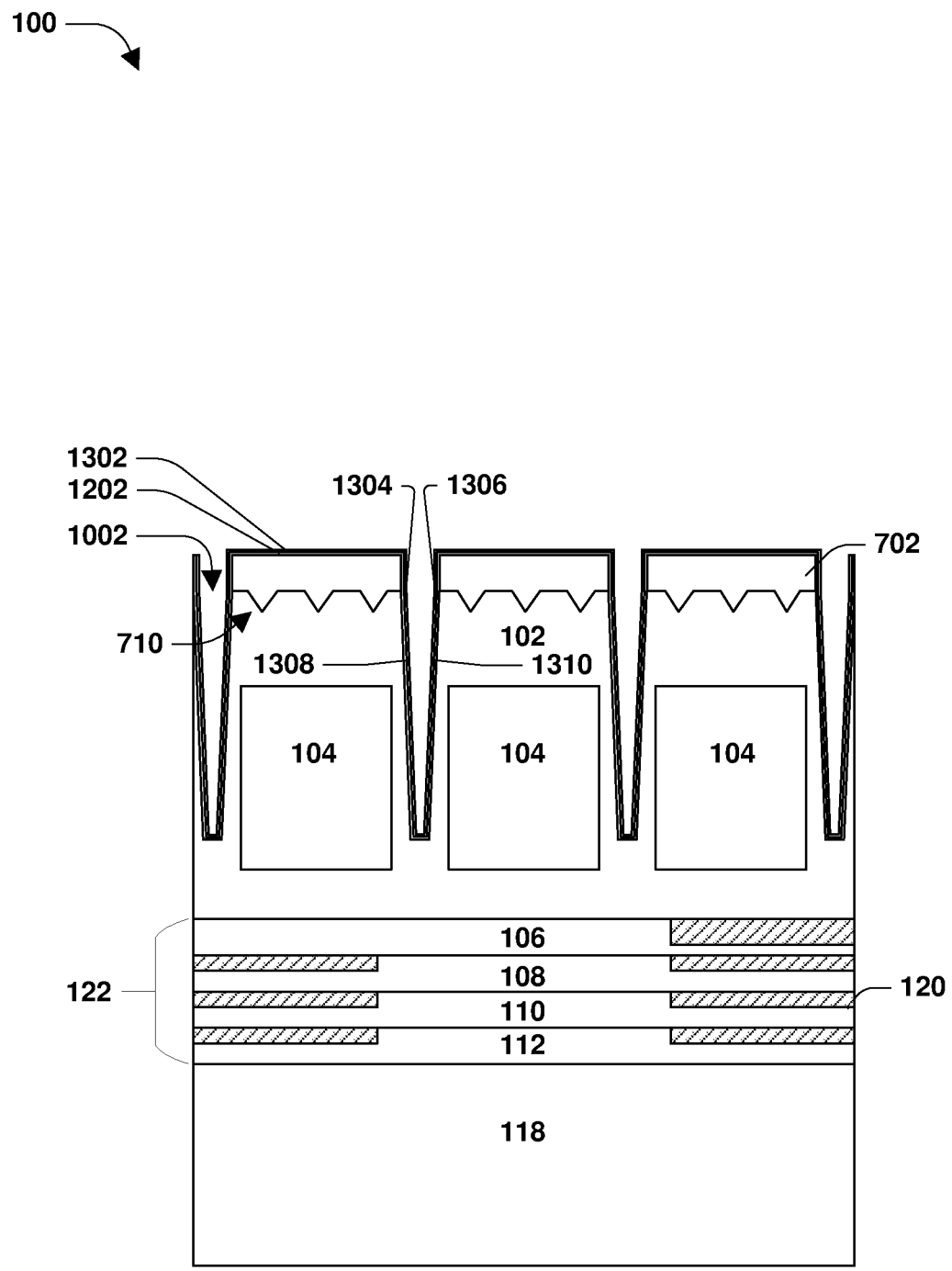

FIG. 13 illustrates a second dielectric layer 1302 formed over the first barrier layer 1202 and in the trenches 1002, according to some embodiments. In some embodiments, the second dielectric layer 1302 is in direct contact with the first barrier layer 1202. In some embodiments, the second dielectric layer 1302 is in indirect contact with the first barrier layer 1202. The first barrier layer 1202 is between the second dielectric layer 1302 and at least one of the first substrate 102 or the first dielectric layer 702. Other structures and/or configurations of the second dielectric layer 1302 relative to other elements, features, etc. are within the scope of the present disclosure.

The second dielectric layer 1302 comprises at least one of silicon dioxide, silicon nitride, silicon oxynitride, hafnium oxide, fluorinated silica glass (FSG), or other suitable material. The second dielectric layer 1302 is formed by at least one of PVD, sputtering, CVD, LPCVD, ALCVD, UHVCVD, RPCVD, ALD, MBE, LPE, spin on, growth, or other suitable techniques. A coefficient of thermal expansion of the second dielectric layer 1302 is between about 1 to about 20 (such as between about 2.5 to about 16). Other structures and/or configurations of the second dielectric layer 1302 are within the scope of the present disclosure.

A first portion of the second dielectric layer 1302 is in a trench 1002. The first portion of the second dielectric layer 1302 has a seventh sidewall 1304 with which a ninth sidewall 1308 of the first portion of the first barrier layer 1202 aligns. The first portion of the second dielectric layer 1302 in the trench 1002 has an eighth sidewall 1306 with which a tenth sidewall 1310 of the first portion of the first barrier layer 1202 aligns. Other structures and/or configurations of the second dielectric layer 1302 relative to other elements, features, etc. are within the scope of the present disclosure.

Figure 14:
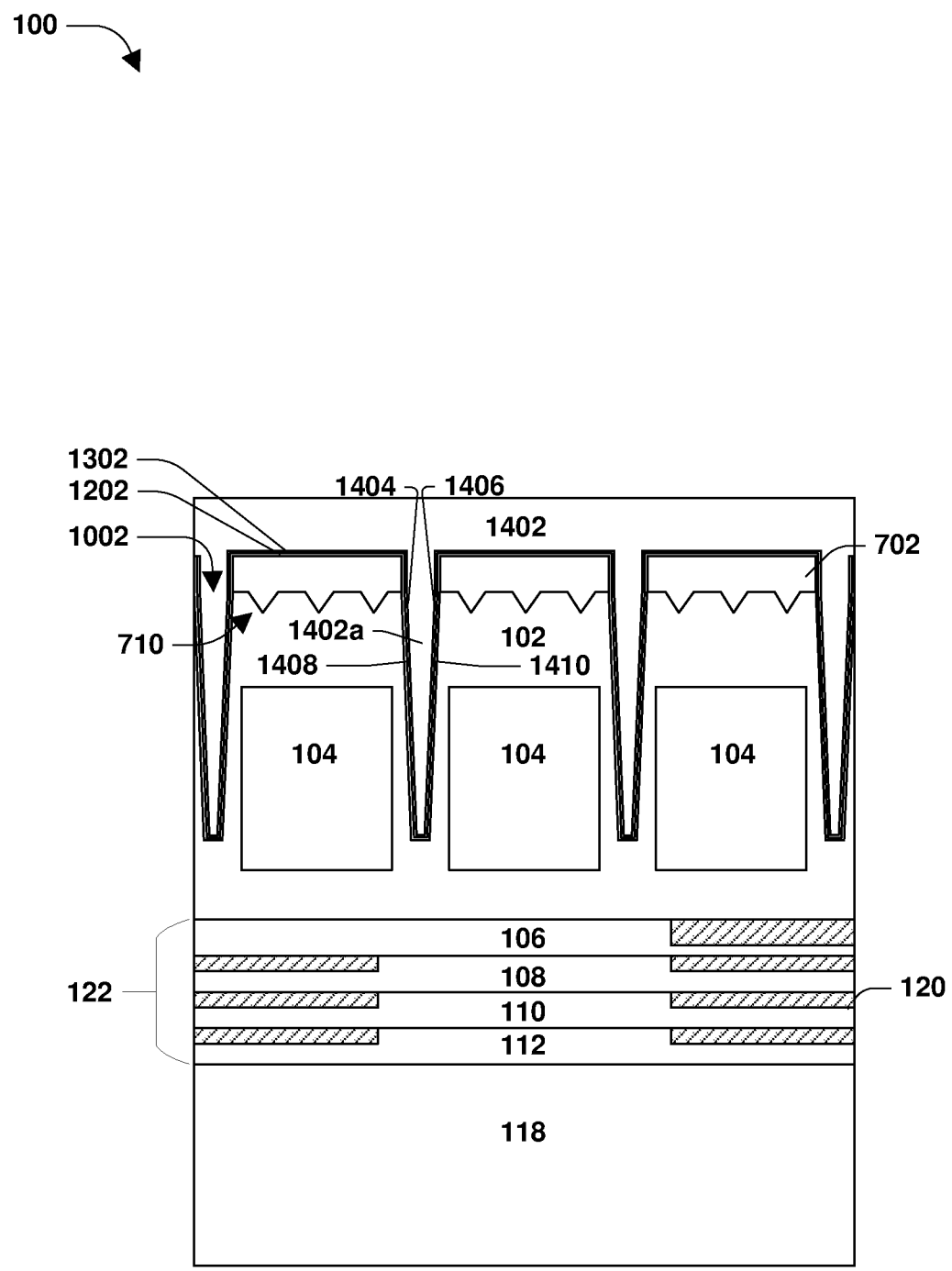

FIG. 14 illustrates a first copper layer 1402 formed over the second dielectric layer 1302 and in the trenches 1002, according to some embodiments. In some embodiments, the first copper layer 1402 is in direct contact with the second dielectric layer 1302. In some embodiments, the first copper layer 1402 is in indirect contact with the second dielectric layer 1302. The second dielectric layer 1302 is between the first copper layer 1402 and the first barrier layer 1202. Other structures and/or configurations of the first copper layer 1402 relative to other elements, features, etc. are within the scope of the present disclosure.

The first copper layer 1402 is formed by at least one of a plating process, PVD, sputtering, CVD, LPCVD, ALCVD, UHVCVD, RPCVD, ALD, MBE, LPE, spin on, growth, or other suitable techniques. In some embodiments, the plating process is performed with a current density of at least about 3 milli-amperes per square centimeter (such as at least about 5 milli-amperes per square centimeter). In some embodiments, an initial current density of the plating process is at least about 3 milli-amperes per square centimeter (such as at least about 5 milli-amperes per square centimeter). In some embodiments, the current density of the plating process increases to at least about 3 milli-amperes per square centimeter (such as least about 5 milli-amperes per square centimeter) within a threshold duration of time after the plating process is started. The threshold duration of time is less than or equal to at least one of about 5 milliseconds, about 10 milliseconds, about 100 milliseconds, about 1 second, or other suitable duration of time. Performing the plating process with the current density and/or the initial current density of at least about 3 milli-amperes per square centimeter (such as at least about 5 milli-amperes per square centimeter) inhibits formation of voids in the first copper layer 1402. Accordingly, the plating process with the current density and/or the initial current density of at least about 3 milli-amperes per square centimeter (such as at least about 5 milli-amperes per square centimeter) provides for a reduction in a porosity of the first copper layer 1402 as compared to other copper layers and/or structures formed with a current density and/or an initial current density of less than 3 milli-amperes per square centimeter (and/or less than 5 milli-amperes per square centimeter). In some embodiments, a seed layer (not shown) is formed, over the second dielectric layer 1302 and in the trenches 1002, prior to performing the plating process. The seed layer comprises at least one of copper or other suitable material. Other processes and/or techniques for forming the first copper layer 1402 are within the scope of the present disclosure.

The second dielectric layer 1302 protects the first barrier layer 1202 from damage, such as during formation of the first copper layer 1402. In some embodiments, the second dielectric layer 1302 inhibits damage to the first barrier layer 1202 during the plating process and/or prevents plating solution, used in the plating process, from dissolving the first barrier layer 1202.

A first portion 1402a of the first copper layer 1402 is in a trench 1002. The first portion 1402a of the first copper layer 1402 has an eleventh sidewall 1404 with which a thirteenth sidewall 1408 of the first portion of the second dielectric layer 1302 aligns. The first portion 1402a of the first copper layer 1402 in the trench 1002 has a twelfth sidewall 1406 with which a fourteenth sidewall 1410 of the first portion of the second dielectric layer 1302 aligns. Other structures and/or configurations of the first copper layer 1402 relative to other elements, features, etc. are within the scope of the present disclosure.

In some embodiments, the first portion of the first barrier layer 1202 in the trench 1002, the first portion of the second dielectric layer 1302 in the trench 1002, and the first portion 1402a of the first copper layer 1402 in the trench 1002 form a DTI structure 1502 (shown in FIG. 15A) that extends through the first dielectric layer 702 and/or into the first substrate 102. The DTI structure 1502 is a backside DTI (BDTI) structure or a different type of DTI structure. The semiconductor device 100 comprises one or more DTI structures 1502. Any number of DTI structures 1502 are contemplated. The DTI structures 1502 are at least one of laterally offset from a component 104 or between two components 104. In some embodiments, a DTI structure 1502 is between two adjacent components 104, the second portion 102b of the first substrate 102 separates the DTI structure 1502 from a first component of the two adjacent components 104, and the third portion 102c of the first substrate 102 separates the DTI structure 1502 from a second component of the two adjacent components 104.

Figure 15A:
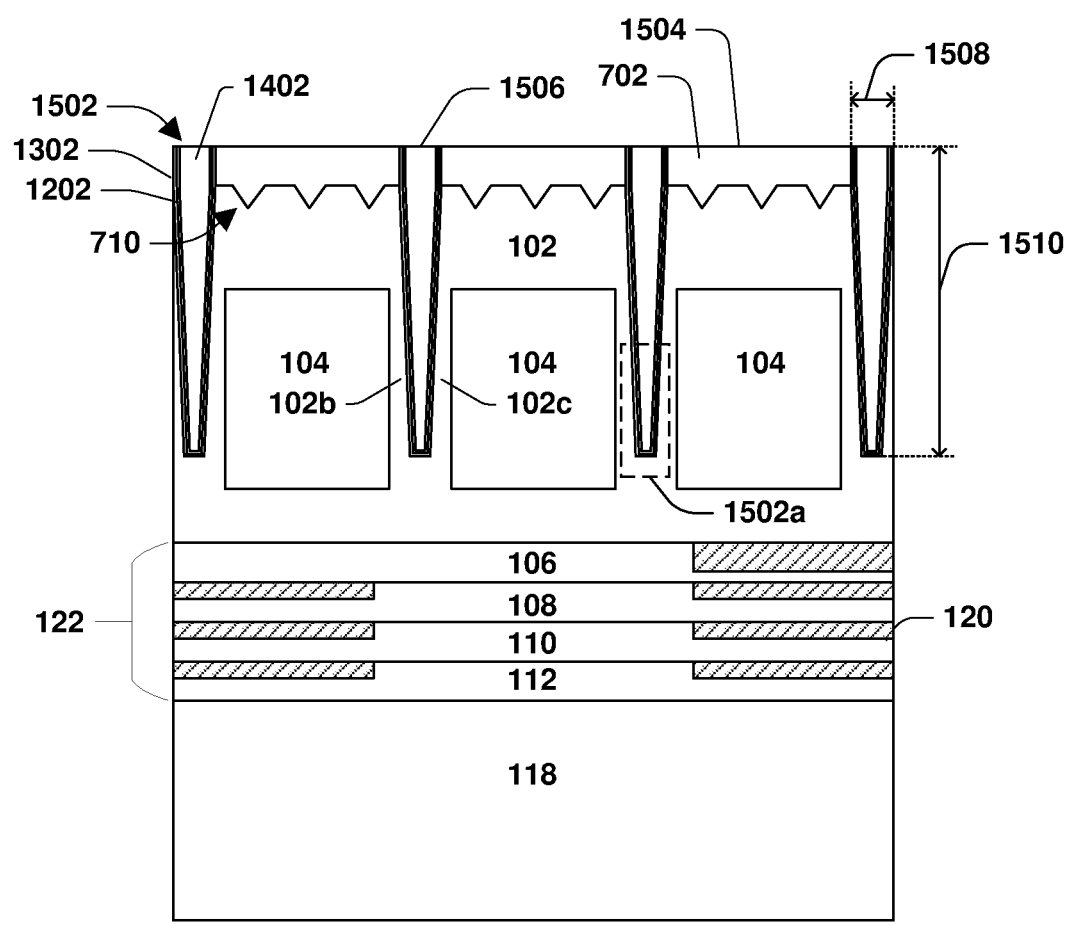
FIG. 15A illustrates a cross-sectional view of a semiconductor device at a stage of fabrication, in accordance with some embodiments.
Figure 15B:
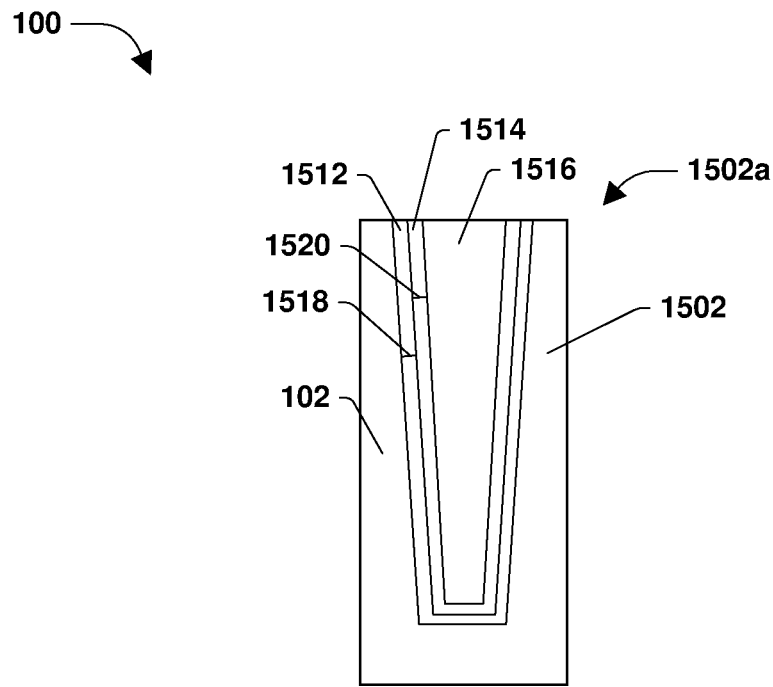
FIG. 15B illustrates a cross-sectional view of a semiconductor device at a stage of fabrication, in accordance with some embodiments.

FIGS. 15A-15B illustrates removal of a first section of the semiconductor device 100, according to some embodiments. In some embodiments, the first section is removed by at least one of CMP, etching, or other suitable techniques. The first section comprises a top section of the semiconductor device 100 that is over the first dielectric layer 702, such as comprising at least one of a portion of the first barrier layer 1202 that is over the first dielectric layer 702, a portion of the second dielectric layer 1302 that is over the first dielectric layer 702, or a portion of the first copper layer 1402 that is over the first dielectric layer 702. In some embodiments, removal of the first section of the semiconductor device 100 exposes at least one of a top surface 1504 of the first dielectric layer 702 or a top surface 1506 of a DTI structure 1502.

A width 1508 of a DTI structure 1502 is between about 600 angstroms to about 67,000 angstroms. A length 1510 of the DTI structure 1502 is between about 3,000 angstroms to about 200,000 angstroms. The length 1510 of the DTI structure 1502 is at least about 3 times (such as at least about 5 times) the width 1508 of the DTI structure 1502, such that the DTI structure 1502 has a relatively high aspect ratio. Other structures and/or configurations of the DTI structures 1502 are within the scope of the present disclosure.

FIG. 15B illustrates an enlarged view of section 1502a (depicted in FIG. 15A) of the semiconductor device 100, according to some embodiments. The section 1502a comprises at least a portion of a DTI structure 1502. The DTI structure 1502 comprises at least one of a barrier structure 1512, a dielectric structure 1514, or a copper structure 1516. The barrier structure 1512 comprises a portion of the first barrier layer 1202. The dielectric structure 1514 comprises a portion of the second dielectric layer 1302. The copper structure 1516 comprises a portion of the first copper layer 1402. The dielectric structure 1514 is between the barrier structure 1512 and the copper structure 1516. The barrier structure 1512 is between the dielectric structure 1514 and the first substrate 102. A thickness 1518 of the barrier structure 1512 is at least about 0.01 times (such as at least about 0.02 times) the width 1508 (FIG. 15A) of the DTI structure 1502. A thickness 1520 of the dielectric structure 1514 is at least about 0.005 times (such as at least about 0.01 times) the width 1508 (FIG. 15A) of the DTI structure 1502. Other structures and/or configurations of the DTI structures 1502 are within the scope of the present disclosure.

Figure 15C:
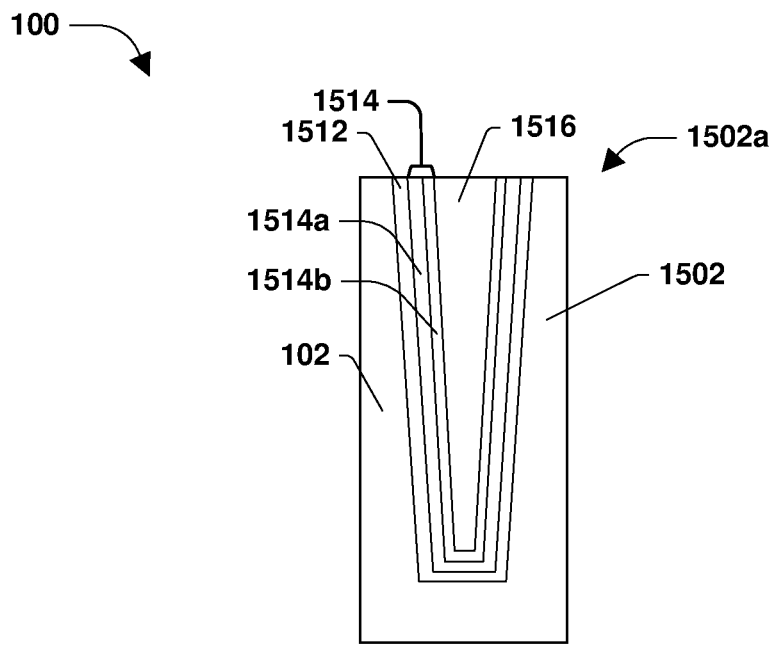
FIG. 15C illustrates a cross-sectional view of a semiconductor device at a stage of fabrication, in accordance with some embodiments.

FIG. 15C illustrates an enlarged view of the section 1502a of the semiconductor device 100, according to some embodiments where the dielectric structure 1514 is a multi-layer structure. The dielectric structure 1514 comprises any number of dielectric layers such that an interface is defined between the layers. In some embodiments, each layer of the dielectric structure 1514, such as at least one of a layer 1514a, a layer 1514b between the layer 1514a and the copper structure 1516, etc., has a coefficient of thermal expansion between about 1 to about 20 (such as between about 2.5 to about 16). Each layer of the dielectric structure 1514 comprises at least one of silicon dioxide, silicon nitride, silicon oxynitride, hafnium oxide, FSG, or other suitable material. In some embodiments, the layer 1514a is different than the layer 1514b. In some embodiments, the layer 1514a comprises a portion of the second dielectric layer 1302 and the layer 1514b comprises a portion of another dielectric layer that is formed over the second dielectric layer 1302 prior to forming the first copper layer 1402. Other structures and/or configurations of the DTI structures 1502 are within the scope of the present disclosure.

In some embodiments, the dielectric structure 1514 protects the first substrate 102 from being damaged by expansion of the copper structure 1516, and thereby improves performance of the semiconductor device 100 and/or reduces an amount of dark current in the semiconductor device 100. In some embodiments, the dielectric structure 1514 acts as a stress release layer to release stress induced as a result of a coefficient of thermal expansion difference between the first substrate 102 and the copper structure 1516.

Figure 16:
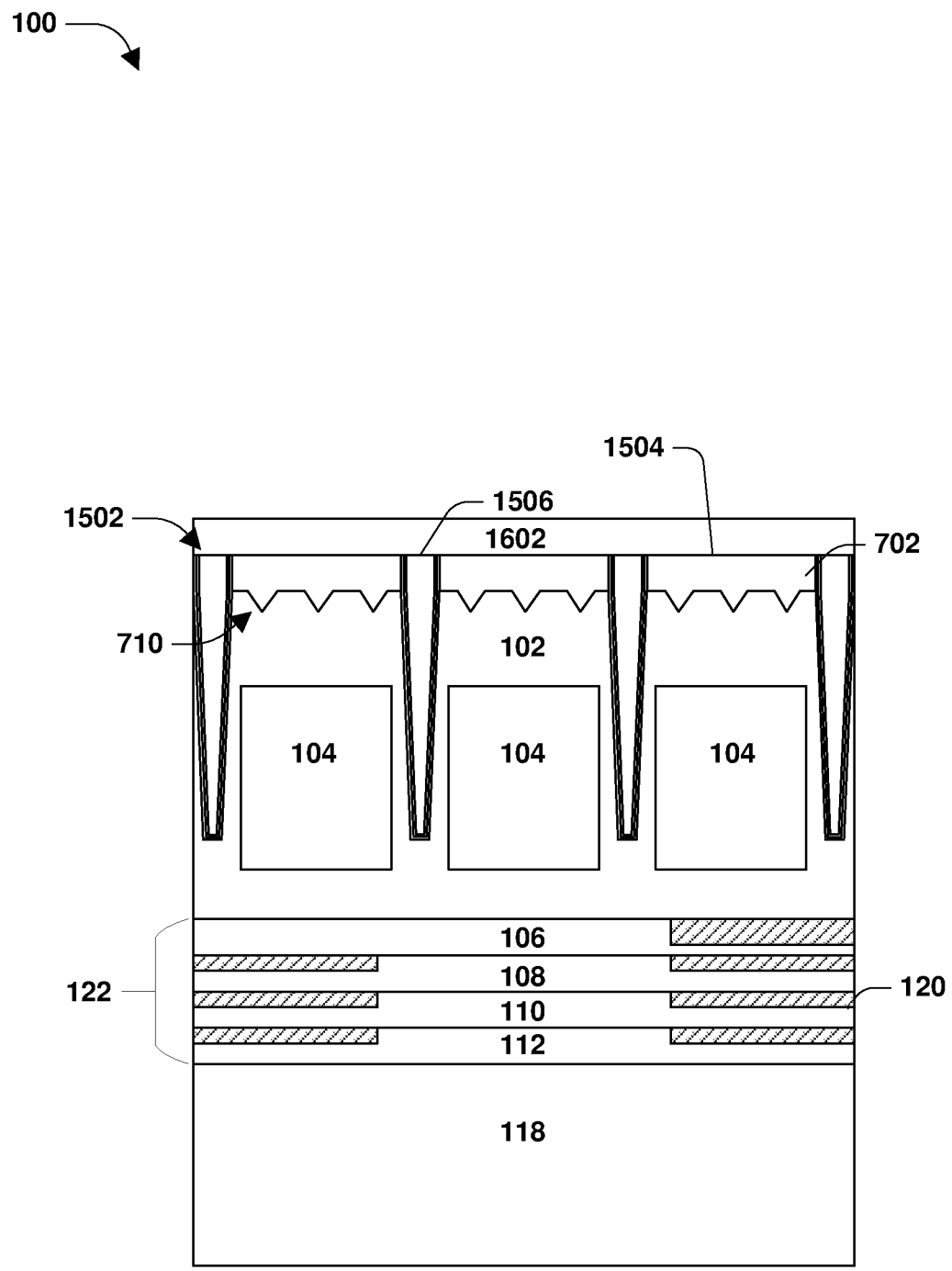
FIGS. 16-17 illustrate cross-sectional views of a semiconductor device at various stages of fabrication, in accordance with some embodiments.

FIG. 16 illustrates a third dielectric layer 1602 formed over the first dielectric layer 702, according to some embodiments. The third dielectric layer 1602 at least one of overlies top surfaces 1506 of the DTI structures 1502, is in direct contact with top surfaces 1506 of the DTI structures 1502, or is in indirect contact with top surfaces 1506 of the DTI structures 1502. The third dielectric layer 1602 at least one of overlies the top surface 1504 of the first dielectric layer 702, is in direct contact with the top surface 1504 of the first dielectric layer 702, or is in indirect contact with the top surface 1504 of the first dielectric layer 702. The third dielectric layer 1602 comprises at least one of SiO, $SiO_2$, SiN, $Si_3N_4$, MgO, $Al_2O_3$, $Yb_2O_3$, ZnO, $Ta_2O_5$, $ZrO_2$, $HfO_2$, $TeO_2$, $TiO_2$, or other suitable material. The third dielectric layer 1602 is formed by at least one of PVD, sputtering, CVD, LPCVD, ALCVD, UHVCVD, RPCVD, ALD, MBE, LPE, spin on, growth, or other suitable techniques. Other structures and/or configurations of the third dielectric layer 1602 are within the scope of the present disclosure.

Figure 17:
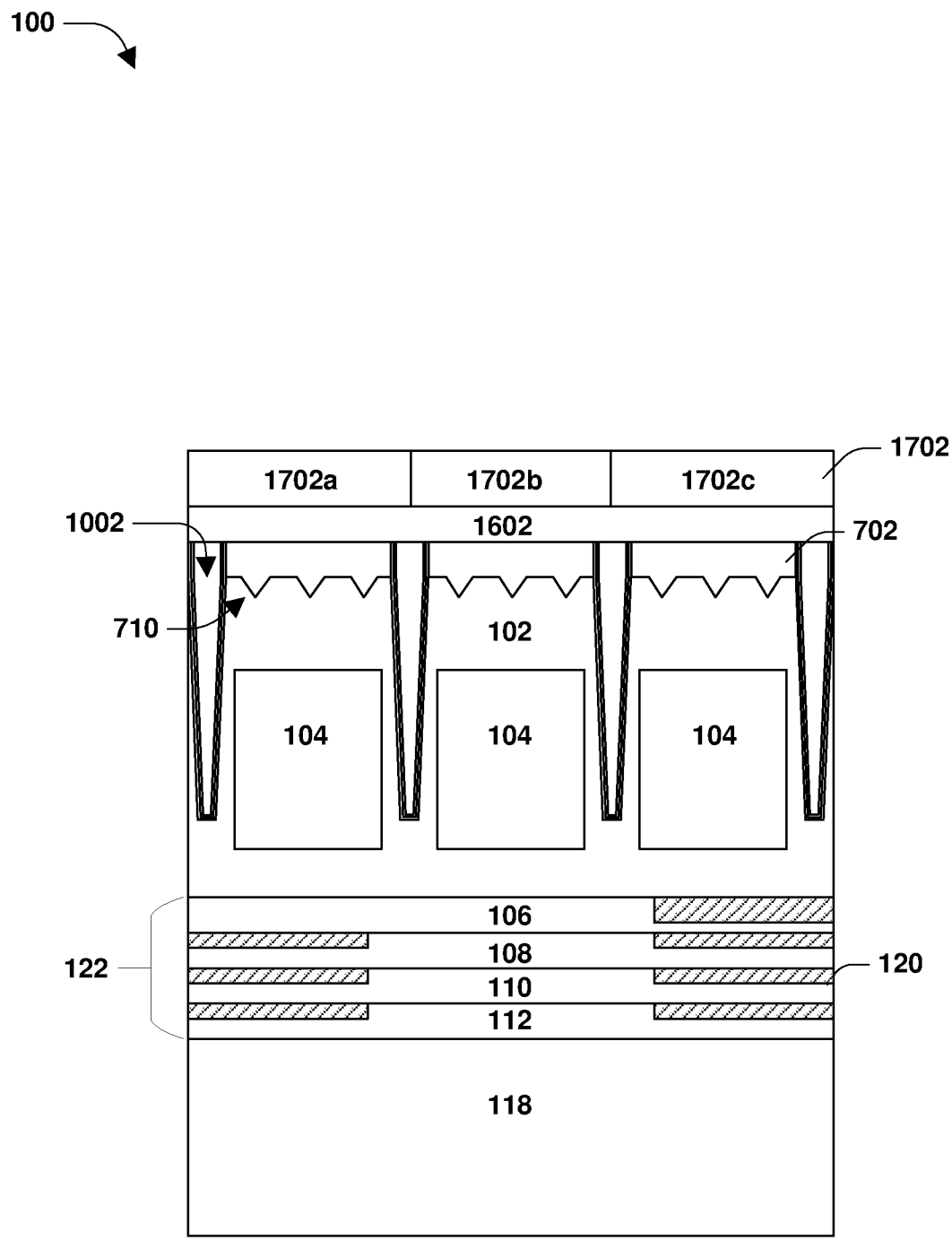

FIG. 17 illustrates a color filter layer 1702 formed over the third dielectric layer 1602, according to some embodiments. The color filter layer 1702 at least one of overlies the third dielectric layer 1602, is in direct contact with a top surface of the third dielectric layer 1602, or is in indirect contact with the top surface of the third dielectric layer 1602. The color filter layer 1702 comprises at least one of a pigment-dispersed color resist (PDCR) material, a photosensitive substance, a photoinitiator substance, a multifunctional monomer, one or more additives, a leveling agent, an adhesion promotor, resin, polymer soluble in alkaline solution, color paste, pigment, dispersant, solvent, or other suitable material. The color filter layer 1702 filters certain wavelengths of radiation. In some embodiments, different portions of the color filter layer 1702 have different material compositions to enable different wavelengths to be filtered. A first portion 1702a of the color filter layer 1702 overlies a first component 104, has a first material composition, and filters first wavelengths. A second portion 1702b of the color filter layer 1702 overlies a second component 104, has a second material composition, and filters second wavelengths different than the first wavelengths. A third portion 1702c of the color filter layer 1702 overlies a third component 104, has a third material composition, and filters third wavelengths different than the first wavelengths and/or the second wavelengths. The color filter layer 1702 is formed by at least one of PVD, sputtering, CVD, LPCVD, ALCVD, UHVCVD, RPCVD, ALD, MBE, LPE, spin on, growth, or other suitable techniques. Other structures and/or configurations of the color filter layer 1702 are within the scope of the present disclosure.

Figure 18A:
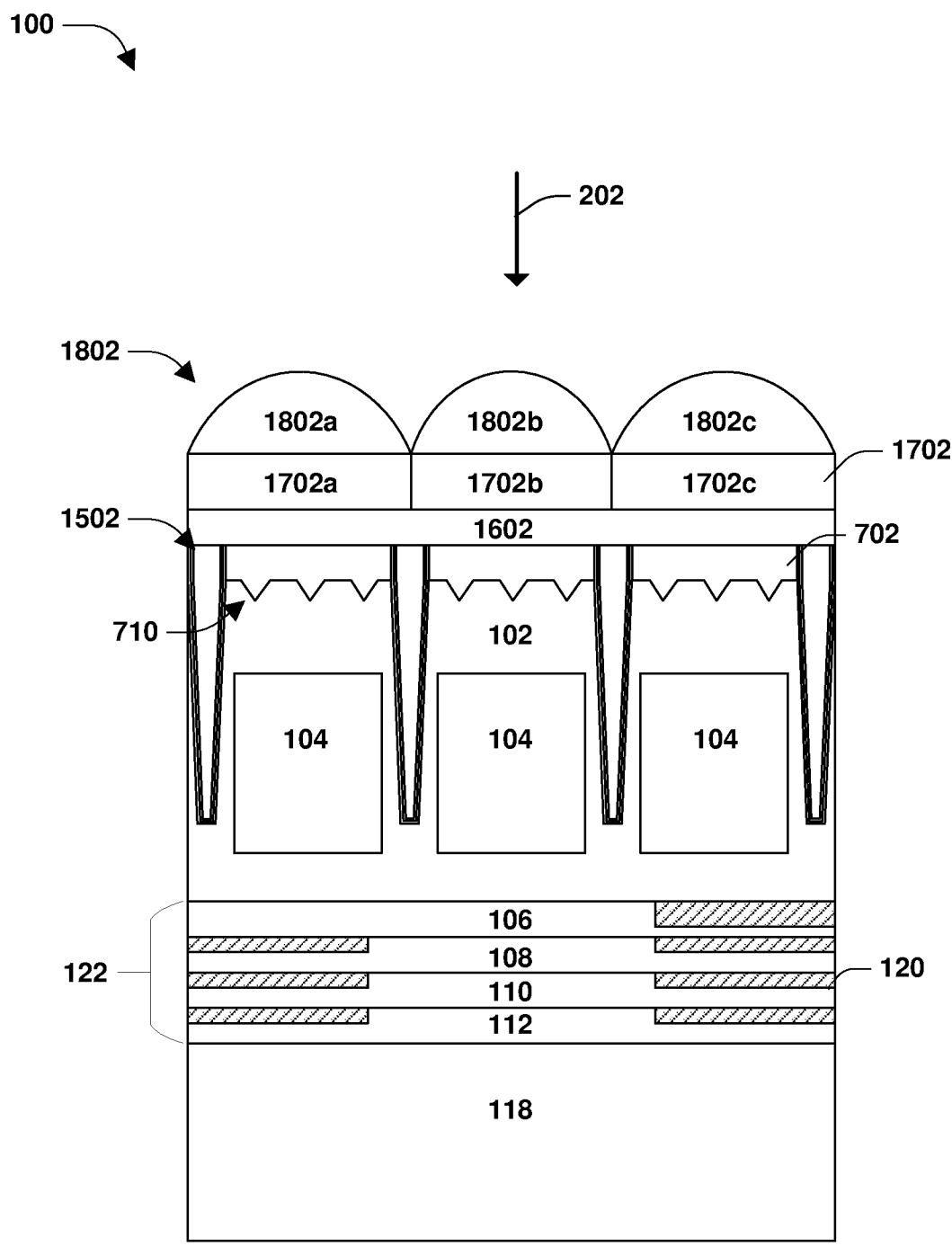
FIG. 18A illustrates a cross-sectional view of a semiconductor device at a stage of fabrication, in accordance with some embodiments.

FIG. 18A illustrates a lens array 1802 formed over the color filter layer 1702, according to some embodiments. In some embodiments, the lens array 1802 at least one of overlies the color filter layer 1702, is in direct contact with a top surface of the color filter layer 1702, or is in indirect contact with the top surface of the color filter layer 1702. In some embodiments, the lens array 1802 is formed by at least one of thermal reflow, microplastic embossing, microdroplet jetting, photolithography, reactive ion etching, machining, or other suitable techniques. Lenses of the lens array 1802 are at least one of micro-lenses or other suitable lenses. The lens array 1802 comprises at least one of a first lens 1802a over a first component 104, a second lens 1802b over a second component 104, or a third lens 1802c over a third component 104. In some embodiments, one or more lenses of the lens array 1802 overlie one or more portions of the first dielectric layer 702 having tapered sidewalls, such as one or more HA structures 710. Other structures and/or configurations of the lens array 1802 are within the scope of the present disclosure.

In some embodiments, radiation is projected towards the semiconductor device 100, such as at least one of in the direction 202 or in a different direction. At least some of the radiation passes through at least one of the lens array 1802, the color filter layer 1702, the third dielectric layer 1602, the first dielectric layer 702, or some of the first substrate 102, and is at least one of sensed, detected, or converted to electrons by the components 104. HA structures 710 provide for an increase in an amount of radiation that is at least one of sensed, detected or converted by the components 104, as compared to other sensors that do not implement the HA structures 710. Implementing the HA structures 710 mitigates reflection or deflection by the first substrate 102 of radiation, projected towards a component 104, away from the component 104. In some embodiments, the radiation comprises NIR radiation, such as radiation with a wavelength between about 700 nanometers to about 2500 nanometers. Other wavelengths of radiation directed to the components 104 by the HA structures 710 are within the scope of the present disclosure.

In some embodiments, DTI structures 1502 prevent and/or mitigate crosstalk between components 104. The DTI structures 1502 prevent and/or mitigate radiation from traveling from one component 104 to an adjacent component 104, or simply away from one component 104 when there is no adjacent the component 104. Radiation traveling away from the component 104 is reflected by a DTI structure 1502 back towards the component 104. Generally, much more radiation is detected by a component 104 when the radiation is redirected back towards the component 104. Implementing the DTI structures 1502 with copper structures, such as the copper structure 1516, provides for an increase in an amount of radiation that is reflected by a DTI structure 1502 back towards a component 104, as compared to other sensors that do not implement the DTI structures 1502 with the copper structures. The increase in the amount of radiation reflected by DTI structures 1502 is due at least to an improved reflectivity of the DTI structures 1502 with copper as compared to other DTI structures that do not comprise copper and/or to a reduced porosity of the DTI structures 1502 as compared to other DTI structures with higher porosities. In some embodiments, a copper structure of a DTI structure 1502 can reflect at least about 95% of radiation, such as NIR radiation, flowing towards the DTI structure 1502. In some embodiments, the reduced porosity of the DTI structures 1502 is due at least to forming the DTI structures 1502 with copper. The reduced porosity of the DTI structures 1502 is due at least to performing the plating process to form the first copper layer 1402 (with which the DTI structures 1502 are formed) with at least one of the current density or the initial current density of at least about 3 milli-amperes per square centimeter (such as at least about 5 milli-amperes per square centimeter). Implementing the DTI structures 1502 with the copper structures, such as the copper structure 1516, provides for a reduction in crosstalk between components 104, such as a reduction of about 40% in NIR crosstalk between components 104 (such as components 104 that are configured to detect NIR radiation), as compared to other sensors that do not implement the DTI structures 1502 with the copper structures.

Figure 18B:
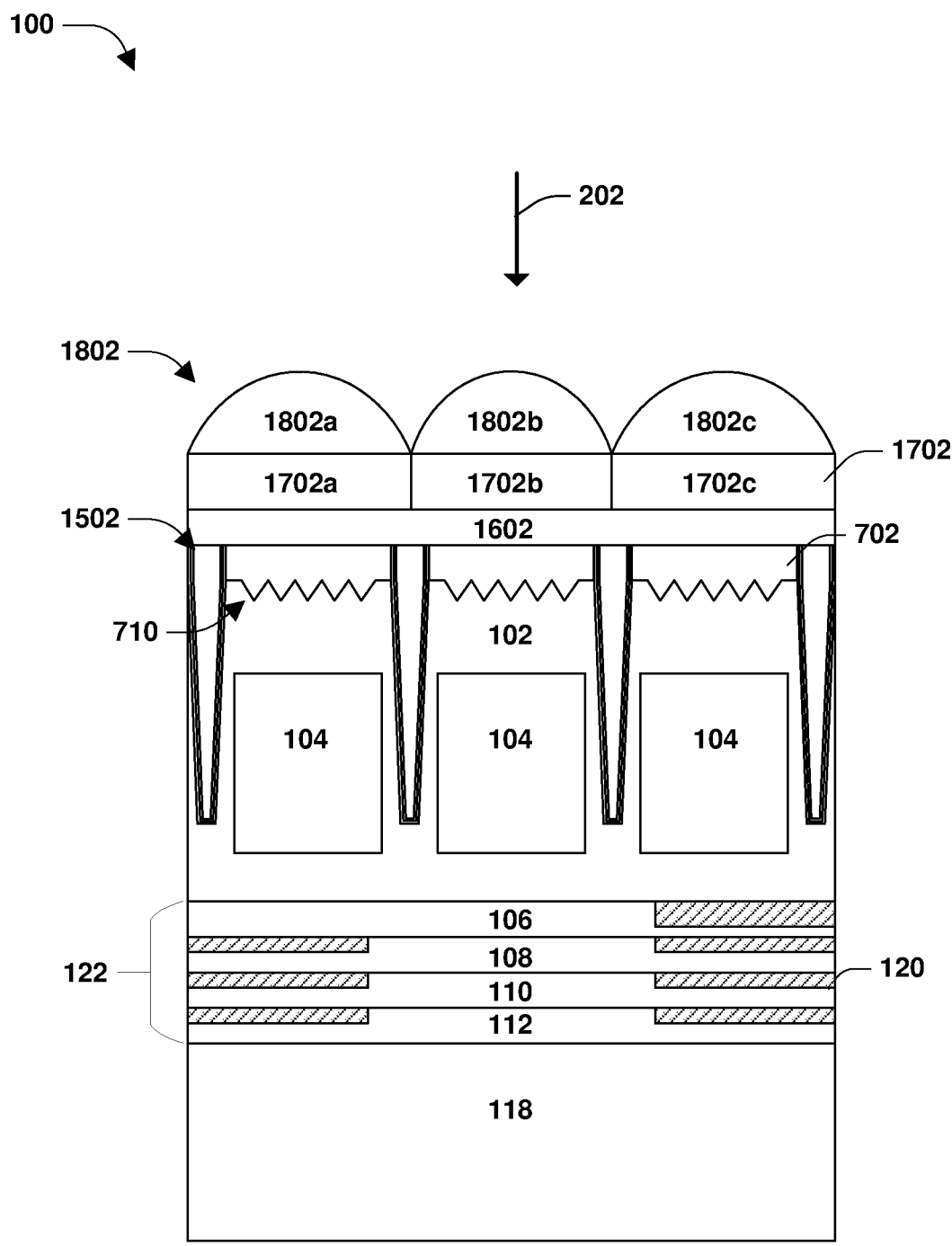
FIG. 18B illustrates a cross-sectional view of a semiconductor device at a stage of fabrication, in accordance with some embodiments.

FIG. 18B illustrates a cross-sectional view of the semiconductor device 100, according to some embodiments where HA structures 710 are directly adjacent each other. In some embodiments, at least some HA structures of a set of HA structures 710 that are between two adjacent DTI structures 1502 are directly adjacent each other, such as in a saw tooth configuration.

In some embodiments, a semiconductor device is provided. The semiconductor device includes a first deep trench isolation (DTI) structure within a substrate. The first DTI structure includes a barrier structure, a dielectric structure, and a copper structure. The dielectric structure is between the barrier structure and the copper structure. The barrier structure is between the substrate and the dielectric structure.

In some embodiments, a coefficient of thermal expansion of the dielectric structure is between about 2.5 to about 16.

In some embodiments, the dielectric structure includes at least one of silicon dioxide, silicon nitride, silicon oxynitride, hafnium oxide, or fluorinated silica glass.

In some embodiments, the barrier structure includes at least one of aluminum oxide, hafnium oxide, or tantalum nitride.

In some embodiments, the semiconductor device includes a first dielectric layer overlying the substrate, wherein a first portion of the first dielectric layer has a first sidewall that aligns with a first portion of a first sidewall of the barrier structure.

In some embodiments, a second portion of the first dielectric layer has a tapered sidewall that aligns with a tapered sidewall of a first portion of the substrate.

In some embodiments, the semiconductor device includes a photodiode within the substrate, wherein the first DTI structure is laterally offset from the photodiode.

In some embodiments, the semiconductor device includes a second DTI structure within the substrate and laterally offset from the photodiode, wherein the photodiode is between the first DTI structure and the second DTI structure.

In some embodiments, the second DTI structure includes a second barrier structure, a second dielectric structure, and a second copper structure. The second dielectric structure is between the second barrier structure and the second copper structure, and the second barrier structure is between the substrate and the second dielectric structure.

In some embodiments, a semiconductor device is provided. The semiconductor device includes a photodiode within a substrate. The semiconductor device includes a first dielectric layer overlying the substrate. A first portion of the first dielectric layer overlies the photodiode. The first portion of the first dielectric layer has a tapered sidewall. A first portion of the substrate separates the first portion of the first dielectric layer from the photodiode. The semiconductor device includes a first deep trench isolation (DTI) structure. The first DTI structure includes a barrier structure, a dielectric structure, and a copper structure. The dielectric structure is between the barrier structure and the copper structure. The barrier structure is between the substrate and the dielectric structure.

In some embodiments, the first portion of the substrate has a first tapered sidewall that aligns with the tapered sidewall of the first portion of the first dielectric layer.

In some embodiments, a second portion of the first dielectric layer overlies the photodiode, the second portion of the first dielectric layer has a tapered sidewall; and the first portion of the substrate has a second tapered sidewall that aligns with the tapered sidewall of the second portion of the first dielectric layer.

In some embodiments, the first tapered sidewall of the first portion of the substrate has a first slope, the second tapered sidewall of the first portion of the substrate has a second slope, and the second slope is opposite in polarity relative to the first slope.

In some embodiments, the first DTI structure is laterally offset from the photodiode.

In some embodiments, a second portion of the substrate separates the first DTI structure from the photodiode.

In some embodiments, the semiconductor device includes a second DTI structure laterally offset from the photodiode. The photodiode is between the first DTI structure and the second DTI structure, the second DTI structure includes a second barrier structure, a second dielectric structure, and a second copper structure, the second dielectric structure is between the second barrier structure and the second copper structure, and the second barrier structure is between the substrate and the second dielectric structure.

In some embodiments, the semiconductor device includes a lens array, wherein a first lens of the lens array overlies the first portion of the first dielectric layer.

In some embodiments, a method for forming a semiconductor device is provided. The method includes forming a first dielectric layer over a substrate. The method includes forming a first trench extending through the first dielectric layer and into the substrate. The method includes forming a first barrier layer over the first dielectric layer and in the first trench. The method includes forming a second dielectric layer over the first barrier layer and in the first trench. The method includes forming a first copper layer over the second dielectric layer and in the first trench.

In some embodiments, forming the first copper layer includes performing a plating process with a current density of at least about 5 milli-amperes per square centimeter.

In some embodiments, the method includes forming a first recess within the substrate, wherein forming the first dielectric layer includes forming a first portion of the first dielectric layer in the first recess, and the first portion of the first dielectric layer overlies a photodiode within the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising".

Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a photodiode within a substrate;
   a first dielectric layer overlying the substrate, wherein:
      a first portion of the first dielectric layer overlies the photodiode;
      the first portion of the first dielectric layer has a tapered sidewall;
      a first portion of the substrate separates the first portion of the first dielectric layer from the photodiode; and
      the first dielectric layer directly contacts the substrate;
   a first deep trench isolation (DTI) structure, wherein:
      the first DTI structure comprises a barrier structure, a dielectric structure, and a copper structure;
      an interface is defined where the barrier structure contacts the first dielectric layer;
      the dielectric structure is between the barrier structure and the copper structure; and
      the barrier structure is between the substrate and the dielectric structure; and
   a second dielectric layer over the first DTI structure, wherein the barrier structure directly contacts the second dielectric layer.

2. The semiconductor device of claim 1, wherein the first portion of the substrate has a first tapered sidewall that aligns with the tapered sidewall of the first portion of the first dielectric layer.

3. The semiconductor device of claim 2, wherein:
   a second portion of the first dielectric layer overlies the photodiode;
   the second portion of the first dielectric layer has a tapered sidewall; and
   the first portion of the substrate has a second tapered sidewall that aligns with the tapered sidewall of the second portion of the first dielectric layer.

4. The semiconductor device of claim 3, wherein:
   the first tapered sidewall of the first portion of the substrate has a first slope;

the second tapered sidewall of the first portion of the substrate has a second slope; and the second slope is opposite in polarity relative to the first slope.

5. The semiconductor device of claim 1, wherein:

the first DTI structure is laterally offset from the photodiode.

6. The semiconductor device of claim 5, comprising:

a second DTI structure laterally offset from the photodiode, wherein:
  the photodiode is between the first DTI structure and the second DTI structure;
  the second DTI structure comprises a second barrier structure, a second dielectric structure, and a second copper structure;
  the second dielectric structure is between the second barrier structure and the second copper structure; and
  the second barrier structure is between the substrate and the second dielectric structure.

7. The semiconductor device of claim 1, comprising:

a lens array, wherein a first lens of the lens array overlies the first portion of the first dielectric layer.

8. A semiconductor device, comprising:

a photodiode within a substrate, wherein a first portion of the substrate overlying the photodiode has a first tapered sidewall;

a first dielectric layer overlying the first tapered sidewall; and a first deep trench isolation (DTI) structure within the substrate and the first dielectric layer and adjacent the photodiode, wherein:
  the first DTI structure comprises a dielectric structure and a copper structure;
  the copper structure completely fills from a first sidewall of the dielectric structure to a second sidewall of the dielectric structure such that there are no voids in the copper structure; and
  the dielectric structure does not overlie the photodiode.

9. The semiconductor device of claim 8, wherein the first DTI structure comprises a barrier structure separated from the copper structure by the dielectric structure.

10. The semiconductor device of claim 8, wherein:

a second portion of the substrate overlying the photodiode has a second tapered sidewall, and a top surface of the substrate between the first tapered sidewall and the second tapered sidewall has a planar surface.

11. A semiconductor device, comprising:

a photodiode within a substrate, wherein a first portion of the substrate overlying the photodiode has a first tapered sidewall;

a first dielectric layer overlying the first tapered sidewall; and a first deep trench isolation (DTI) structure within the substrate and the first dielectric layer and adjacent the photodiode, wherein:
  the first DTI structure comprises a dielectric structure and a copper structure;
  the copper structure completely fills from a first sidewall of the dielectric structure to a second sidewall of the dielectric structure such that there are no voids in the copper structure; and
  the dielectric structure and the copper structure do not overlie the photodiode.

12. The semiconductor device of claim 11, wherein the first DTI structure comprises a barrier structure separated from the copper structure by the dielectric structure.

13. The semiconductor device of claim 12, wherein a material composition of the barrier structure is different than a material composition of the first dielectric layer.

14. The semiconductor device of claim 12, wherein the barrier structure is between the substrate and a bottommost surface of the dielectric structure.

15. The semiconductor device of claim 12, wherein the dielectric structure is separated from the first dielectric layer by the barrier structure.

16. The semiconductor device of claim 11, wherein:

a second portion of the substrate overlying the photodiode has a second tapered sidewall, and a top surface of the substrate between the first tapered sidewall and the second tapered sidewall has a planar surface.

17. The semiconductor device of claim 11, wherein:

the first DTI structure comprises a barrier structure, and the semiconductor device comprises a second dielectric layer over the first DTI structure, wherein the barrier structure directly contacts the second dielectric layer.

18. The semiconductor device of claim 11, comprising:

a second dielectric layer over the first DTI structure, wherein the dielectric structure directly contacts the second dielectric layer.

19. The semiconductor device of claim 11, comprising:

a second dielectric layer over the first DTI structure, wherein the copper structure directly contacts the second dielectric layer.

20. The semiconductor device of claim 11, wherein:

a coefficient of thermal expansion of the dielectric structure is between about 2.5 to about 16.

* * * * *